United States Patent
Ono et al.

(10) Patent No.: US 7,576,393 B2
(45) Date of Patent: Aug. 18, 2009

(54) SEMICONDUCTOR DEVICE AND METHOD OF MANUFACTURING THE SAME

(75) Inventors: Syotaro Ono, Yokohama (JP); Wataru Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 11/476,595

(22) Filed: Jun. 29, 2006

(65) Prior Publication Data

US 2007/0001194 A1 Jan. 4, 2007

(30) Foreign Application Priority Data

Jun. 30, 2005 (JP) .............................. 2005-191454

(51) Int. Cl.
 *H01L 23/62* (2006.01)
(52) U.S. Cl. ...................... 257/341; 257/342; 257/328; 257/135; 257/339; 257/329; 257/493; 257/492; 257/E29.257; 257/E29.262
(58) Field of Classification Search ................ 257/342, 257/328, 135, 339, 341, 329, 492, 493, E29.257, 257/E29.262
See application file for complete search history.

(56) References Cited

U.S. PATENT DOCUMENTS

| | | | |
|---|---|---|---|
| 5,216,275 A | | 6/1993 | Chen |
| 6,274,904 B1 * | | 8/2001 | Tihanyi ...................... 257/329 |
| 6,291,856 B1 | | 9/2001 | Miyasaka et al. |
| 6,300,171 B1 * | | 10/2001 | Frisina ........................ 438/140 |
| 6,410,958 B1 * | | 6/2002 | Usui et al. ................... 257/329 |
| 6,551,909 B1 | | 4/2003 | Fujihira |
| 6,576,516 B1 * | | 6/2003 | Blanchard .................... 438/268 |
| 6,586,798 B1 * | | 7/2003 | Frisina ......................... 257/328 |
| 6,611,021 B1 * | | 8/2003 | Onishi et al. ................. 257/328 |
| 6,630,698 B1 * | | 10/2003 | Deboy et al. ................. 257/285 |
| 6,633,064 B2 | | 10/2003 | Auerbach et al. |
| 6,639,272 B2 * | | 10/2003 | Ahlers et al. ................. 257/328 |
| 6,677,643 B2 | | 1/2004 | Iwamoto et al. |
| 6,683,347 B1 * | | 1/2004 | Fujihira ...................... 257/341 |
| 6,693,338 B2 * | | 2/2004 | Saitoh et al. ................. 257/492 |
| 6,740,931 B2 * | | 5/2004 | Kouzuki et al. ............. 257/341 |
| 6,762,455 B2 * | | 7/2004 | Oppermann et al. ........ 257/335 |
| 6,787,420 B2 * | | 9/2004 | Miyasaka et al. ........... 438/268 |
| 6,821,824 B2 * | | 11/2004 | Minato et al. ............... 438/138 |
| 6,828,609 B2 | | 12/2004 | Deboy et al. |
| 6,838,729 B2 | | 1/2005 | Schlögl et al. |
| 6,888,195 B2 | | 5/2005 | Saito et al. |
| 6,900,109 B2 | | 5/2005 | Onishi et al. |

(Continued)

FOREIGN PATENT DOCUMENTS

JP 2000-40822 2/2000

(Continued)

*Primary Examiner*—Bradley K Smith
*Assistant Examiner*—Alexander Belousov
(74) *Attorney, Agent, or Firm*—Oblon, Spivak, McClelland, Maier & Neustadt, P.C.

(57) ABSTRACT

A semiconductor device comprises a pillar layer including first semiconductor pillars of a first conduction type and second semiconductor pillars of a second conduction type formed laterally, periodically and alternately. The first and second semiconductor pillars include a plurality of diffusion layers formed in a third semiconductor layer as coupled along the depth. The diffusion layers have lateral widths varied at certain periods along the depth. An average of the lateral widths of the diffusion layers in one certain period is made almost equal to another between different periods.

16 Claims, 23 Drawing Sheets

U.S. PATENT DOCUMENTS

| | | |
|---|---|---|
| 6,936,892 B2 | 8/2005 | Fujihira |
| 6,979,862 B2 | 12/2005 | Henson |
| 6,995,426 B2 | 2/2006 | Okumura et al. |
| 2003/0224588 A1 | 12/2003 | Yamauchi et al. |
| 2004/0108568 A1* | 6/2004 | Qu ............................ 257/500 |
| 2004/0150039 A1* | 8/2004 | Henson ...................... 257/330 |
| 2004/0224455 A1* | 11/2004 | Henson et al. ............. 438/200 |
| 2004/0245570 A1 | 12/2004 | Ninomiya |

FOREIGN PATENT DOCUMENTS

| | | |
|---|---|---|
| JP | 2001-119022 | 4/2001 |
| JP | 2001-267568 | 9/2001 |
| JP | 2004-14554 | 1/2004 |

\* cited by examiner

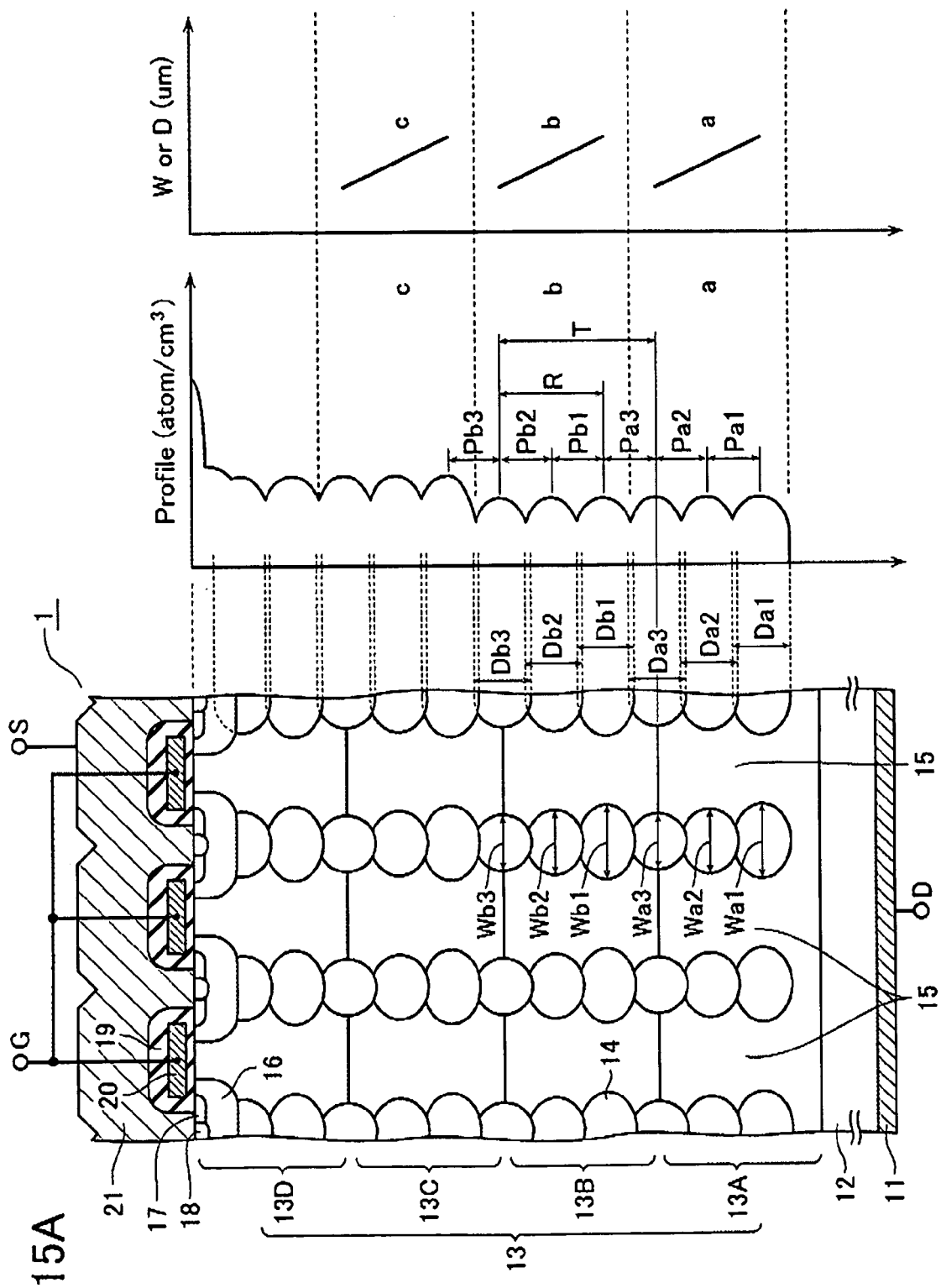

SEMICONDUCTOR DEVICE AND METHOD OF MANUFACTURING THE SAME

CROSS REFERENCE TO RELATED APPLICATION

This application is based on and claims the benefit of priority from prior Japanese Patent Application No. 2005-191454, filed on Jun. 30, 2005, the entire contents of which are incorporated herein by reference.

BACKGROUND OF THE INVENTION

1. Field of the Invention

The present invention relates to a semiconductor device and method of manufacturing the same, and more particularly to a semiconductor device having a super junction structure with p-type pillars and n-type pillars formed laterally, periodically and alternately in a drift layer, and method of manufacturing the device.

2. Description of the Related Art

A vertical power MOSFET has an on-resistance greatly dependent on the electrical resistance in a conduction layer (drift layer) thereof. The electrical resistance in the drift layer is determined from its impurity concentration, and the on-resistance can be lowered as the impurity concentration is made higher. A higher impurity concentration, however, lowers the breakdown voltage across a PN junction formed by the drift layer together with a base layer. Accordingly, the impurity concentration can not be made higher than the limit determined in accordance with the breakdown voltage. Thus, there is a tradeoff between the device breakdown voltage and the on-resistance. An improvement in tradeoff is one important subject matter to provide a semiconductor device of low power dissipation. The tradeoff has a limit determined from device material, and exceeding the limit is a way to realize a low-on-resistance semiconductor device.

As an example of the MOSFET to solve the problem, there is a known structure, which is referred to as a superjunction structure with p-type pillar layers and n-type pillar layers buried in a drift layer laterally and alternately. In the superjunction structure, the quantities of charges (the quantities of impurities) contained in the p-type pillar layers and the n-type pillar layers are equalized to artificially create a non-doped layer. This is effective to retain a high breakdown voltage and cause a current flowing through highly doped, n-type pillar layers, thereby realizing a low on-resistance that exceeds the material limit.

A superjunction structured MOSFET can be given a higher device breakdown voltage as the superjunction structure has a larger thickness. The larger thickness, however, complicates the process steps correspondingly.

It is effective on the other hand in the superjunction structured MOSFET to narrow a lateral period (pitch) of the super-junction structure to achieve a further reduced on-resistance. A narrower width facilitates a p-n junction to deplete on non-conduction and correspondingly it makes it possible to increase the impurity concentration in a pillar layer.

If PN pillars have a cell pitch of 5 μm, achievement of a breakdown voltage of 300 V requires the pillar layer of the superjunction structure to have a thickness of about 17 μm. When the P pillar occupies one half of the cell pitch, the P pillar should be formed to have an aspect ratio of about 6-8. Such the narrow-width and high-aspect-ratio pillar layer may be formed in the following manufacturing method. This method comprises forming a deep trench below the surface of an epitaxial layer, and burying a semiconductor of a different conduction type in the trench by epitaxial growth (see JP-A 2004-14554).

Another manufacturing method comprises forming a buried layer selectively in a high-resistance epitaxial layer by ion implantation and diffusion, and additionally stacking a high-resistance epitaxial layer thereon to form a buried layer by ion implantation and diffusion in the same manner as in the lower layer. These steps are repeated several times (see JP-A 2000-40822). In this case, each high-resistance epitaxial layer should be formed to have a thickness enough to connect the vertically located n-type and p-type diffusion layers. Accordingly, achievement of a high aspect ratio requires a longer diffusion time or an increase in the number of steps of epitaxial growth and ion implantation.

SUMMARY OF THE INVENTION

In one aspect the present invention provides a semiconductor device, comprising: a first semiconductor layer of a first conduction type; a pillar layer including first semiconductor pillars of the first conduction type and second semiconductor pillars of a second conduction type formed laterally, periodically and alternately on the first semiconductor layer; a first main electrode electrically connected to the first semiconductor layer; a semiconductor base layer of the second conduction type formed selectively on a surface of the pillar layer; a second semiconductor layer of the first conduction type formed selectively on a surface of the semiconductor base layer; a second main electrode electrically connected to the second semiconductor layer and the semiconductor base layer; and a control electrode formed along the semiconductor base layer with an insulator interposed there between to form a channel between the second semiconductor layer and the first semiconductor pillars, wherein the first and second semiconductor pillars include a plurality of diffusion layers formed in a third semiconductor layer as coupled along the depth, the third semiconductor layer formed on the first semiconductor layer, wherein the plurality of diffusion layers have lateral widths varied at certain periods along the depth, wherein an average of the lateral widths of the diffusion layers in one of the certain periods is made almost equal to another between different periods.

In another aspect the present invention provides a method of manufacturing a semiconductor device, comprising: forming an epitaxial layer of a first conduction type on a semiconductor substrate of the first conduction type, and then implanting an impurity into a certain region in the epitaxial layer through multiple repetitions of ion implantation with different implantation energy, both repeatedly certain times; forming a pillar layer including first semiconductor pillars of the first conduction type and second semiconductor pillars of a second conduction type laterally, periodically and alternately on the first semiconductor layer by vertically interconnecting regions containing the impurity thermally diffused therein; forming a semiconductor base layer of the second conduction type selectively on a surface of the pillar layer; forming a second semiconductor layer of the first conduction type selectively on a surface of the semiconductor base layer; forming an insulator along the second semiconductor layer, the semiconductor base layer and the first semiconductor pillars, and forming a control electrode along the insulator; and forming a first main electrode electrically connected to the first semiconductor layer, and a second main electrode electrically connected to the second semiconductor layer and the semiconductor base layer.

BRIEF DESCRIPTION OF THE DRAWINGS

FIG. 15A is a cross-sectional view schematically illustrative of an arrangement of a power MOSFET according to a second embodiment of the present invention;

DETAILED DESCRIPTION OF THE INVENTION

Embodiments of the present invention will now be described with reference to the drawings.

First Embodiment

Figure 1:
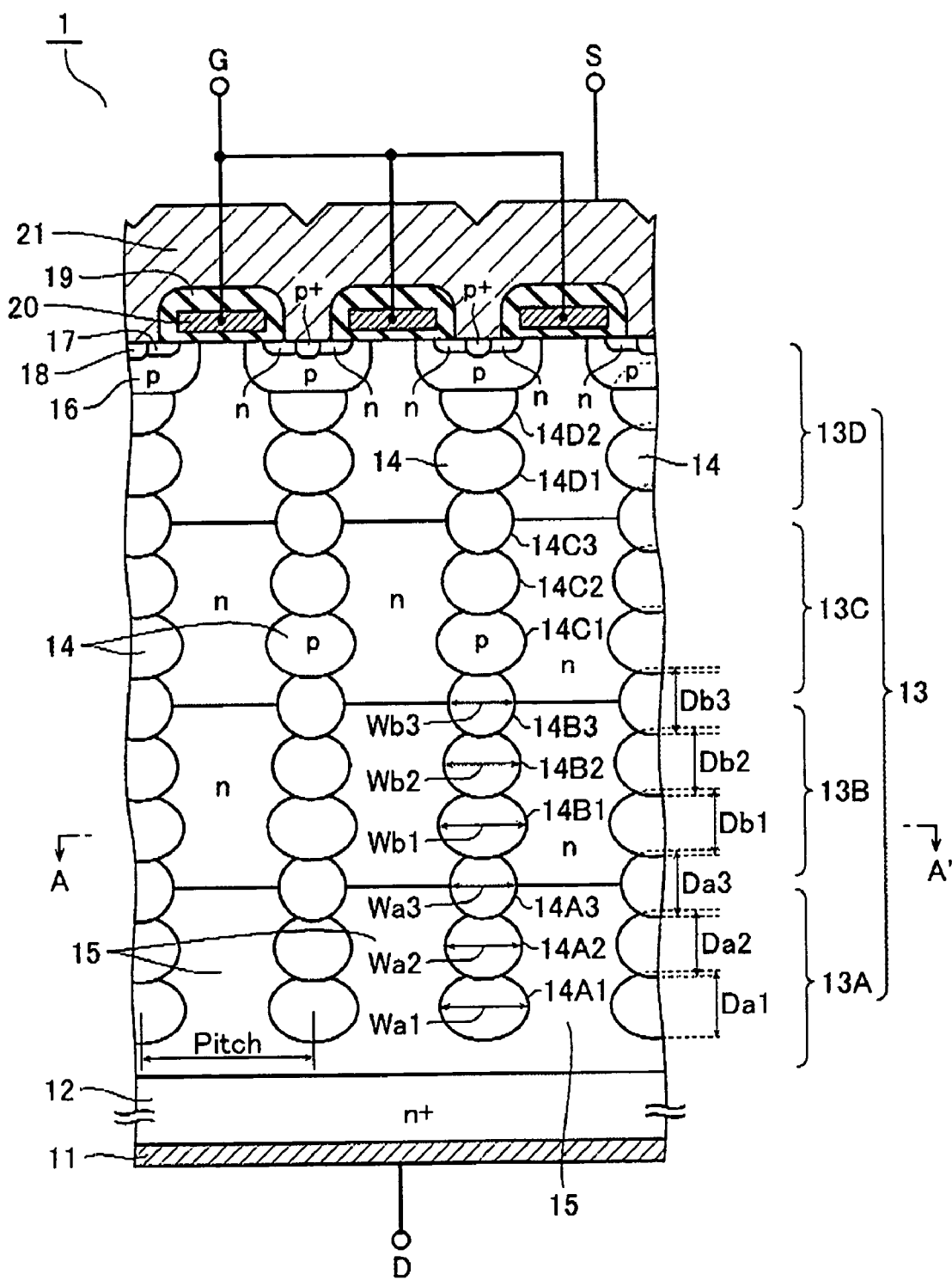
FIG. 1 is a cross-sectional view schematically illustrative of an arrangement of a power MOSFET according to a first embodiment of the present invention.

FIG. 1 is a cross-sectional view schematically illustrative of an arrangement of a power MOSFET according to a first embodiment of the present invention. The MOSFET 1 includes an n-type epitaxial layer 13 on a surface of an $n^+$-type drain layer 12. In the n-type epitaxial layer 13, p-type pillars 14 are formed at a certain pillar pitch, Pitch. The p-type pillars 14, and n-type pillars 15 each sandwiched between the p-type pillars 14 and formed in the n-type epitaxial layer 13 form a superjunction structure. The p-type pillars 14 and the n-type pillars 15 in this embodiment are designed to have respective striped shapes extending in the direction normal to the page.

In a surface of the p-type pillar 14, a p-type base layer 16 is selectively formed by diffusion, and in a surface of the p-type base layer 16, an n-type source layer 17 and a $p^+$-type contact layer 18 are selectively formed by diffusion. The p-type base layer 16 and the n-type source layer 17 are also designed to have respective striped shapes extending in the direction normal to the page, like the p-type pillar 14 and the n-type pillar 15.

A gate insulator 19 is formed over a region that extends from the p-type base layer 16 and the n-type source layer 17 through the n-type pillar 15 to the p-type base layer 16 and the n-type source layer 17 adjacent thereto. The gate insulator 19 is composed of a silicon oxide with a thickness of about 0.1 μm at portions facing the channel and 0.2 μm or more at portions facing the source electrode 21, for example. A gate electrode 20 is formed in the shape of a stripe on the gate insulator 19. A source electrode 21 is formed as sandwiching the gate electrode 20 on the p-type base layer 16 and the n-type source layer 17. A drain electrode 11 is formed on the lower surface of the $n^+$-type drain layer 12. The gate electrode 20 and the source electrode 21 are also formed to have respective striped shapes having the longitudinal direction in the direction normal to the page, like the n-type source layer 17 and so forth.

The p-type pillar 14 in this embodiment is formed of a plurality of diffusion layers 14X1, 14X2, 14X3 (X=A, B, C, D) formed by application of ion implantation and diffusion to the n-type epitaxial layer 13 and coupled along the depth. The n-type epitaxial layer 13 is formed in parts through multiple operations, for example, four operations of epitaxial growth. Four epitaxial layers 13X (X=A, B, C, D) are formed through respective growth steps and stacked to form the n-type epitaxial layer 13.

This embodiment is characterized in that multiple operations of ion implantation with different implantation energy are executed in one epitaxial layer 13X at an interval corresponding to the pillar pitch P in the pillar layer. This is different from the technologies disclosed in JP-A 2004-14554 and the like, in which ions are implanted only once into one epitaxial layer. In FIG. 1, ions are implanted repeatedly three times into one epitaxial layer 13A at an identical position in the lateral direction, followed by thermal diffusion. As a result, three diffusion layers 14A1, 14A2, 14A3 are formed in one epitaxial layer 13A as aligned along the depth and coupled to each other. The number of the diffusion layers 14X aligned along the depth in one epitaxial layer 13X is not limited to three but can be determined at an arbitrary number in consideration of a desired aspect ratio, a maximum acceleration voltage in ion implantation equipment to be used, and other factors. The number of the diffusion layers 14X is not limited to three, either. Changing ion-implantation depth more frequently in one epitaxial layer 13X makes the impurity concentration profile of the p-type pillar layer in its vertical direction close to flat.

In this embodiment, compared to the technologies disclosed in the JP-A 2004-14554 and the like, the number of repetitions of epitaxial layer formation and ion implantation can be made smaller. In addition, it is possible to finely pattern the pillar pitch and accordingly achieve a lower on-resistance.

As described above, into one epitaxial layer 13X at one position in the lateral direction, ions are implanted multiple times with different implantation energy. For example, the acceleration voltage in the ion implantation equipment is made higher for implantation to a deep position (such as the diffusion layer 14A1 in the epitaxial layer 13A) and made lower for implantation to a shallow position. For example, if the epitaxial layer 13A has a thickness of about 8.7 µm, the acceleration voltage in the ion implantation equipment for use in implantation of an impurity that becomes a seed of each diffusion layer 14A is varied as follows. (The numeric characters in round brackets denote an implantation depth below the surface of the epitaxial layer 13X).

Epitaxial layer 13X1: 5.0 MeV (5.9 µm)
Epitaxial layer 13X2: 2.2 MeV (3.0 µm)
Epitaxial layer 13X3: 90 KeV (0.2 µm)

For example, a mask selectively disposed on the epitaxial layer 13X with an oxide film interposed therebetween may have an aperture width of 2.0 um. In this case, the impurity implanted to the above-described depth is thermally diffused about 0.5-1.0 µm laterally from the mask edge and vertically within a radius of about 1.5 um. As a result, the diffusion layers 14A1, 14A2, 14A3 are formed in one epitaxial layer 13X at positions aligned along the depth and coupled to each other. The similar steps are applied to all epitaxial layers 13A-D to form respective p-type pillars 14 to complete the superjunction structure. The epitaxial layer 13X other than the lowermost epitaxial layer 13A suffers diffusion of the impurity implanted into the epitaxial layer located one-layer below. Accordingly, under the above condition, even the epitaxial layer 13X with the thickness of about 8.7 µm can couple the diffusion layers 14X with each other to form the p-type pillar 14. Therefore, under the above condition, one epitaxial layer 13X can be given an aspect ration of 8.7 [µm]/3 [µm]= 2.9. The conventional method of implanting ions once into one epitaxial layer results in an aspect ratio of about 1-2 at most. Therefore, it is possible for this embodiment to form a pillar layer with a high aspect ratio through a few steps. The use of ion implantation equipment with higher implantation energy allows an impurity to be implanted to a deeper position, thereby forming one thick epitaxial layer 13X and further increasing the aspect ratio. Thus, it is possible to further reduce the process steps. In addition, forming a plurality of the diffusion layers 14X in one epitaxial layer 13X generates many portions in which electric field is stronger or weaker, thus increasing avalanche withstanding capability. Giving a gradient of impurity concentration in one p-type pillar as shown in FIG. 15 (described later) further increases avalanche withstanding capability.

In some cases, the p-type pillars 14 may not be allowed to reach the bottom of the lowermost epitaxial layer 13A. In these cases, the lowermost epitaxial layer 13A is not required to have the same thickness as that of the upper epitaxial layer 13X even under the above condition, but rather allowed to have an arbitrary value.

Figure 2:
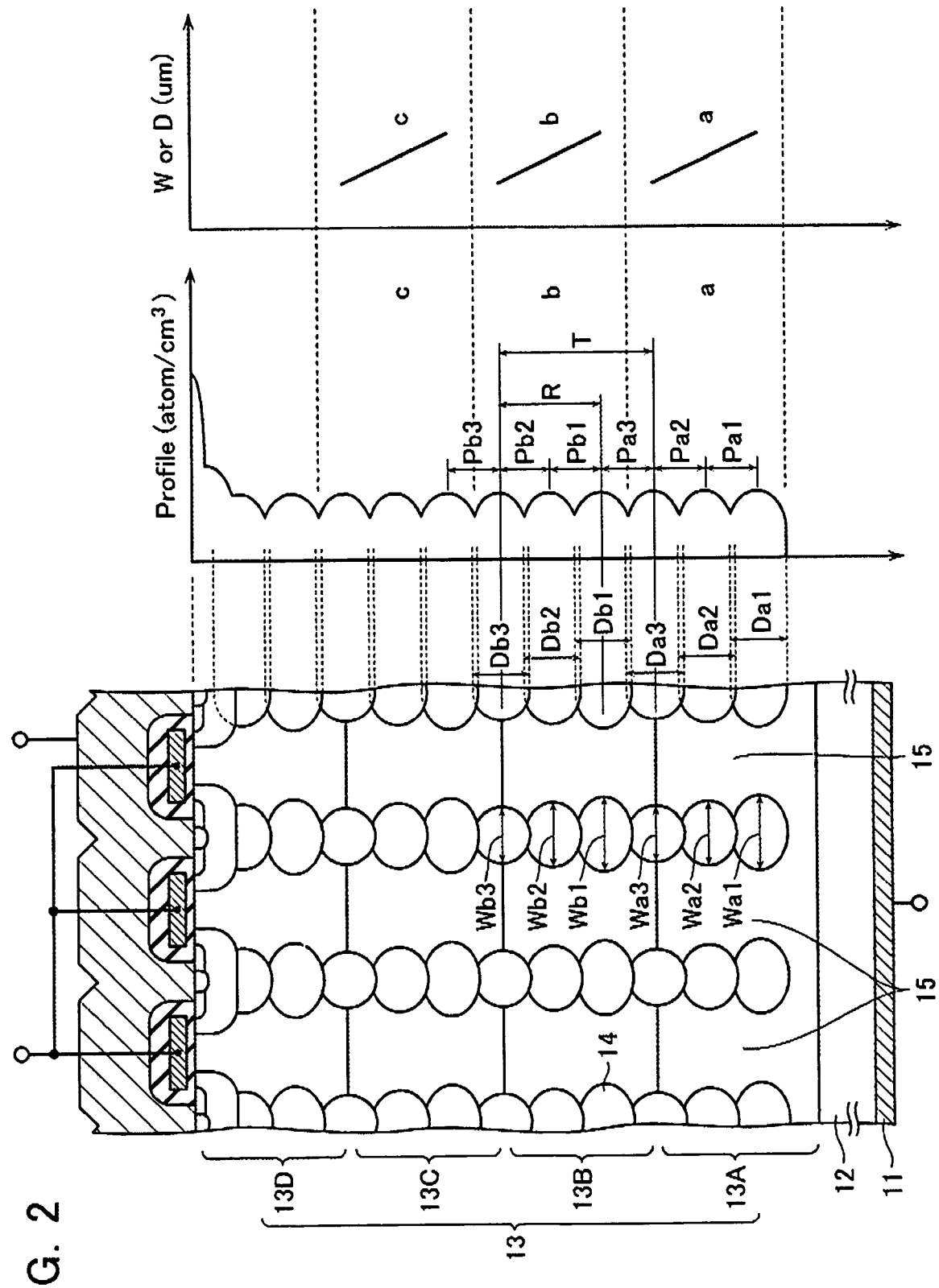
FIG. 2 shows a graph of a distribution of impurity concentrations along the depth in a p-type pillar 14 of FIG. 1, and a graph of lateral widths W and vertical depths D in a diffusion layer 14X.

FIG. 2 shows a graph of a distribution of impurity concentrations along the depth in the p-type pillar 14, and a graph of lateral widths W and vertical depths D in the diffusion layer 14X, corresponding to the structure of the MOSFET of FIG. 1. The lateral width W is a measured value of the widest portion of each diffusion layer 14X. The vertical depth D is a measured value of a height of one diffusion layer 14X containing an overlapped portion between the upper and lower layers.

The three diffusion layers 14A1, 14A2, 14A3 formed in one epitaxial layer 13X differ from each other in implantation depth, implantation energy and so forth and accordingly have different lateral widths W after suffering thermal diffusion. As described later, a common mask may be employed in operations of ion implantation with different implantation energy applied to one epitaxial layer 13X. In this case, in one epitaxial layer 13A the lowermost diffusion layer 14A1 has the largest lateral width Wa1. The lateral width Wa2 of the middle diffusion layer 14A2 and the lateral width Wa3 of the uppermost diffusion layer 14A3 are smaller than Wa1. This is because the lower the layer, the longer the implantation distance and the larger the ion implantation energy, and accordingly the impurity can be implanted wider immediately after implantation before thermal diffusion. Under the usual condition, Wa3<Wa2<Wa1 is frequently realized. These matters are similarly found in the upper epitaxial layers 13B-13D. Therefore, the lateral widths W of the diffusion layer 14X vary periodically at periods along the depth (a, b, c in FIG. 2). In addition, a total or average of the lateral widths W in each of the epitaxial layers 13A-13D is made almost equal to others among the layers. Therefore, the p-type pillar 14 has a shape of an approximate trapezoid when a portion of each epitaxial layer 13X is viewed, and a shape of an approximate rectangle when the whole layers 13A-13D are viewed over.

The vertical depths D of the diffusion layer 14 vary almost in proportion to the lateral widths W. Accordingly, generally speaking, in one epitaxial layer 13A, the vertical depth Da1 of the lowermost diffusion layer 14A1 is largest, and the vertical depth Da2 of the diffusion layer 14A2 and the vertical depth Da3 of the diffusion layer 14A3 are smaller than Da1. Under general condition, Da3<Da2<Da1 is frequently realized. These matters are similarly found in other epitaxial layers 13B-13D. Therefore, the vertical depths D of the diffusion layers 14X vary periodically at periods along the depth (a, b, c in FIG. 2). In addition, a total or average of the vertical depths D in each of the epitaxial layers 13A-13D is made almost equal to others among the layers. A distribution of impurity concentrations has three peaks corresponding to the number of the diffusion layers 14X in one epitaxial layer 13X and peak-peak widths P thereof vary periodically at periods a, b, c along the depth (periodT). Namely, as shown in FIG. 2, peak-peak distances in a distribution of impurity concentrations based on the three diffusion layers 14X formed in one epitaxial layer 13X are defined as Px1, Px2, Px3 (x=a, b, c, ... ) from below. In this case, Px1, Px2, Px3 vary periodically at the periods a, b, c. Although FIG. 2 shows Px1, Px2, Px3 as in Px3<Px2<Px1 like the variation of W and D, Px1<Px2<Px3 may be realized instead.

Such the processes can be applied to form the superjunction structure to realize a pillar impurity profile close to that in an ideal superjunction structure. The conventional manufacturing method comprises executing ion implantation once per epitaxial growth, followed by stacking to form a superjunction structure. Then, the buried impurity is diffused for connection to form a pillar layer. Accordingly, in the impurity profile of the pillar layer, the larger the growth thickness, the larger the amplitude of the profile. On the other hand, when the manufacturing method of this embodiment is used, ion implantation is executed several times even with the same epitaxial growth thickness. Therefore, the diffusion distance can be shortened. This makes it possible to reduce the amplitude of the profile and form an ideal profile with a high aspect ratio.

The thickness of one epitaxial layer 13X is denoted with T [μm], and the distance between peaks of the impurity concentration in the uppermost layer and the lowermost layer in the epitaxial layer 13X with the thickness T is denoted with R [μm]. In this case, the depth of the diffusion layer 13X is preferably determined so as to realize R>T/2. If R=<T/2, the aspect ratio of the pillar layer achievable per one epitaxial layer 13X may not exceed two. More preferably, when an average of the widths Wx1, Wx2, Wx3 of three diffusion layers 14X in one epitaxial layer 13X is denoted with Wave, preferably T−R>Wave×0.3 is realized. Connection of the diffusion layers 14X per period a, b, c by diffusion requires connection of the diffusion layer 14A3 formed at the uppermost portion in the first epitaxial layer 13A with the diffusion layer 14B1 formed at the deepest portion in the second epitaxial layer 13B by diffusion. As diffusions are made about W/2 from respective diffusion sources (implanted positions on ion implantation), a distance between the diffusion sources may satisfy W>T−R. If T−R is larger, the diffusion layers 14X may not be connected with each other possibly. In addition, even if they are connected with each other, the amplitude of the impurity concentration in the diffusion layer 14X (a difference in concentration between a high concentration portion and a low concentration portion in the p-type pillar 14) is made larger. Decreasing the difference in concentration requires determination of T−R at near zero. In this case, however, the thickness of the epitaxial layer 13X per layer can not be thickened. Accordingly, the process cost is increased and a high aspect ratio can not be achieved. Achievement of a high aspect ratio together with determination of a difference in impurity concentration below double at the connection between the diffusion layers 14X per unit period a, b, c preferably requires TX−RX>WX×0.3.

Figure 3:
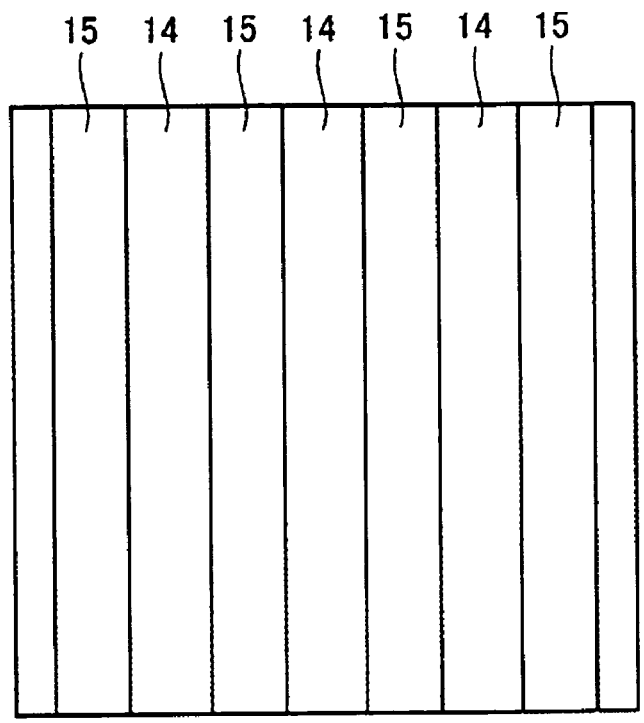
FIG. 3 shows an example of the structure in section A-A' of FIG. 1.
Figure 4:
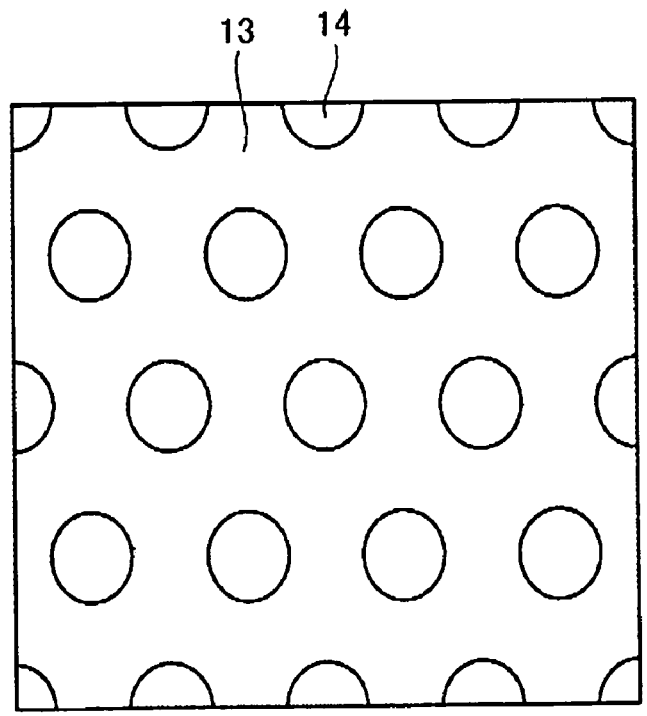
FIG. 4 shows another example of the structure in section A-A' of FIG. 1.

The section A-A' of the p-type pillars 14 and the n-type pillars 15 in FIG. 1 may have the structure of stripes shown in FIG. 3 as described above. Alternatively, the p-type pillars 14 may be arrayed in a grid or zigzag as shown in FIG. 4.

Figure 5:
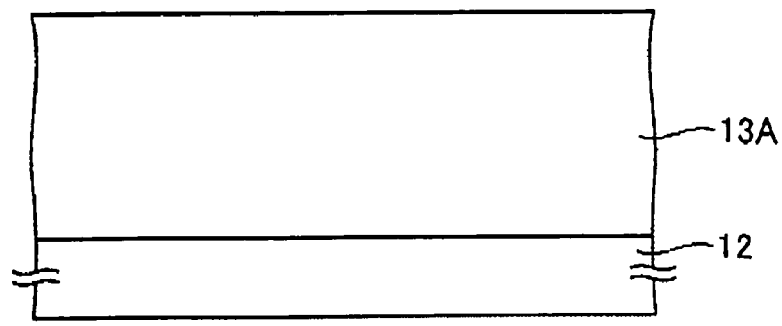
FIG. 5 shows a process step of manufacturing the power MOSFET of FIG. 1.
Figure 6:
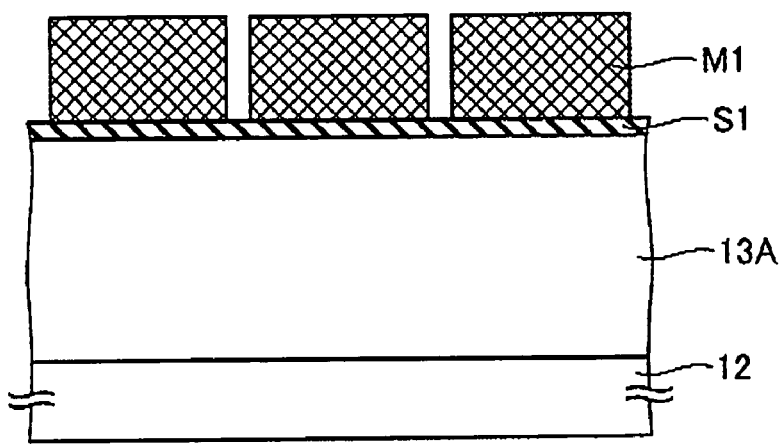
FIG. 6 shows a process step of manufacturing the power MOSFET of FIG. 1.
Figure 7:
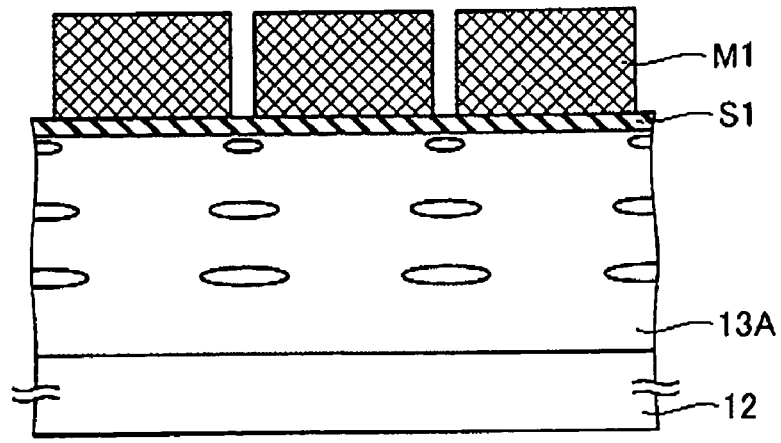
FIG. 7 shows a process step of manufacturing the power MOSFET of FIG. 1.
Figure 8:
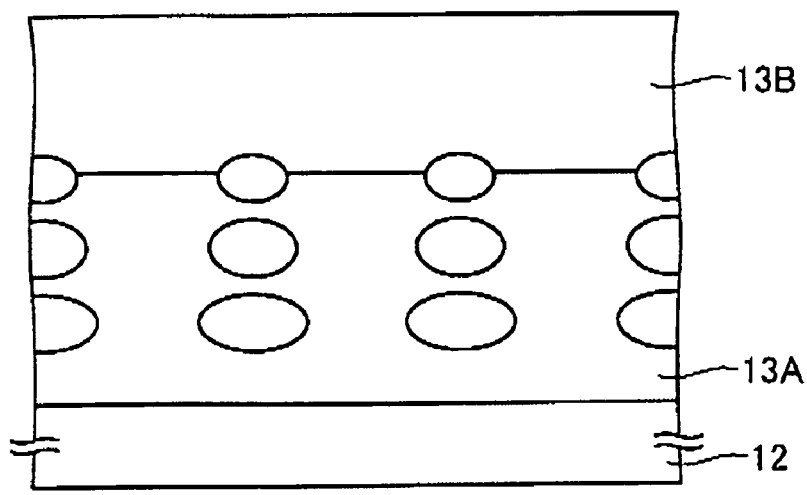
FIG. 8 shows a process step of manufacturing the power MOSFET of FIG. 1.
Figure 9:
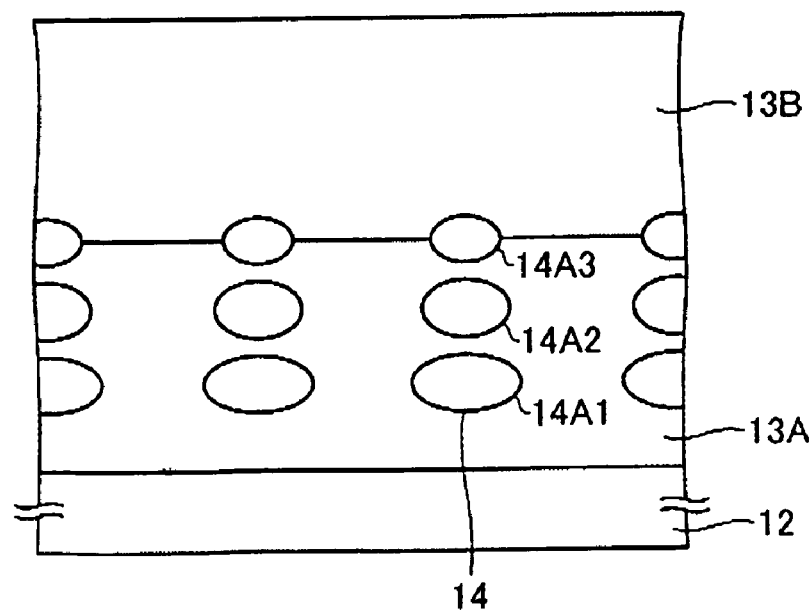
FIG. 9 shows a process step of manufacturing the power MOSFET of FIG. 1.
Figure 10:
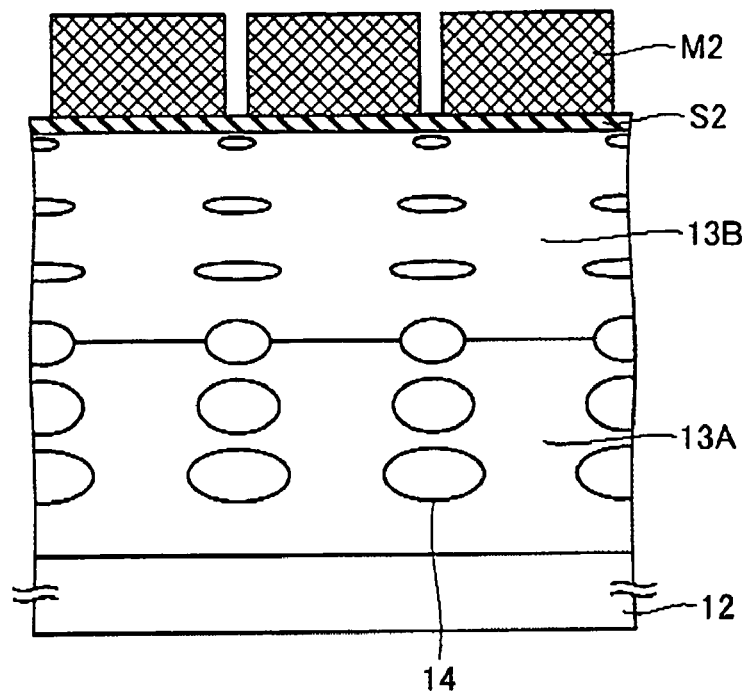
FIG. 10 shows a process step of manufacturing the power MOSFET of FIG. 1.
Figure 11:
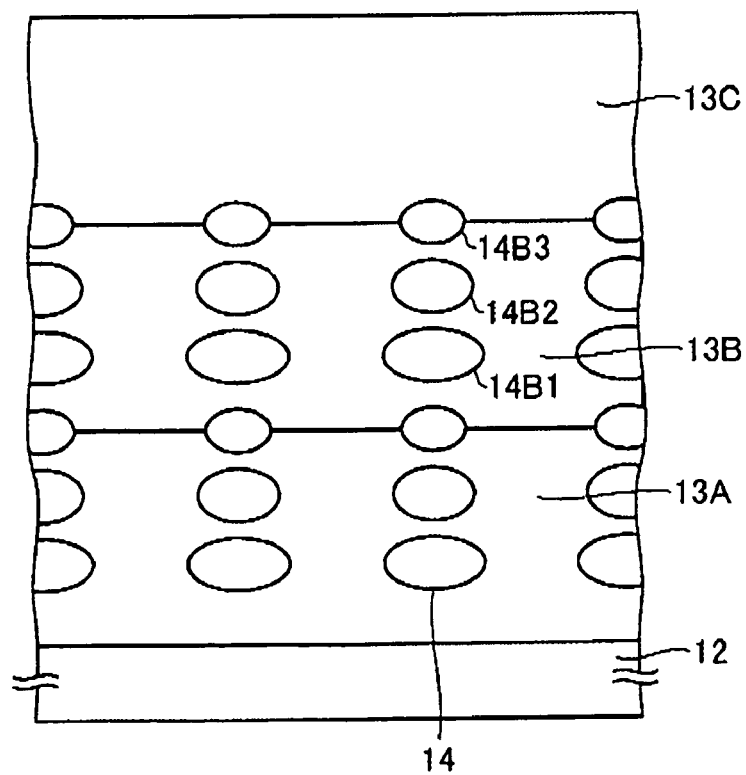
FIG. 11 shows a process step of manufacturing the power MOSFET of FIG. 1.
Figure 12:
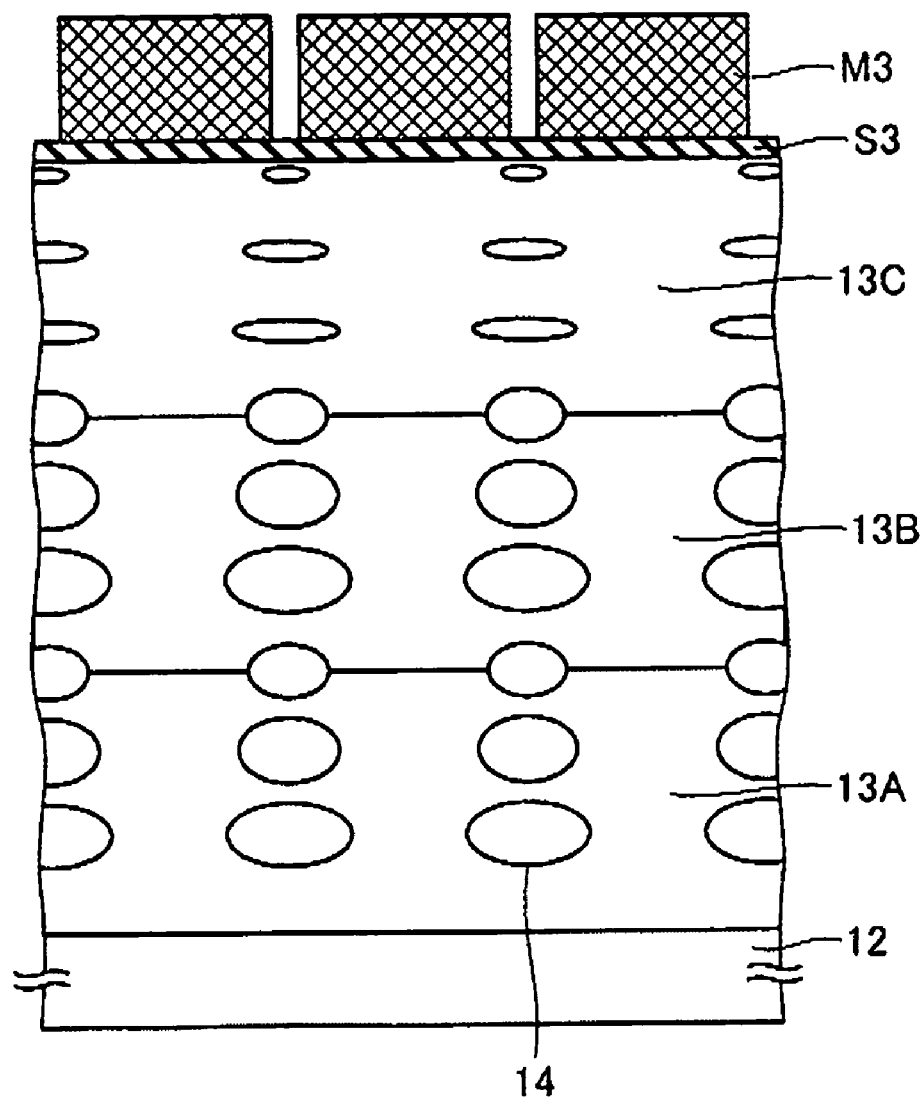
FIG. 12 shows a process step of manufacturing the power MOSFET of FIG. 1.
Figure 13:
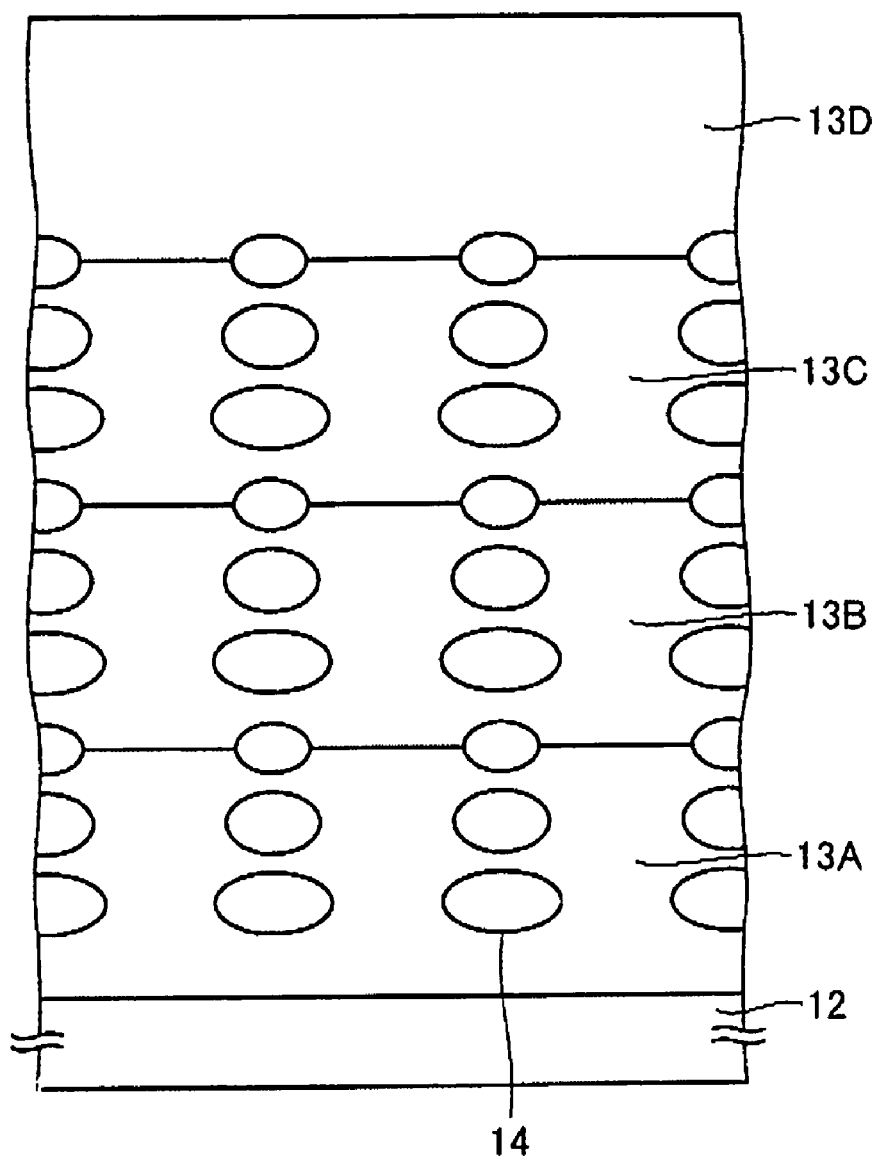
FIG. 13 shows a process step of manufacturing the power MOSFET of FIG. 1.
Figure 14:
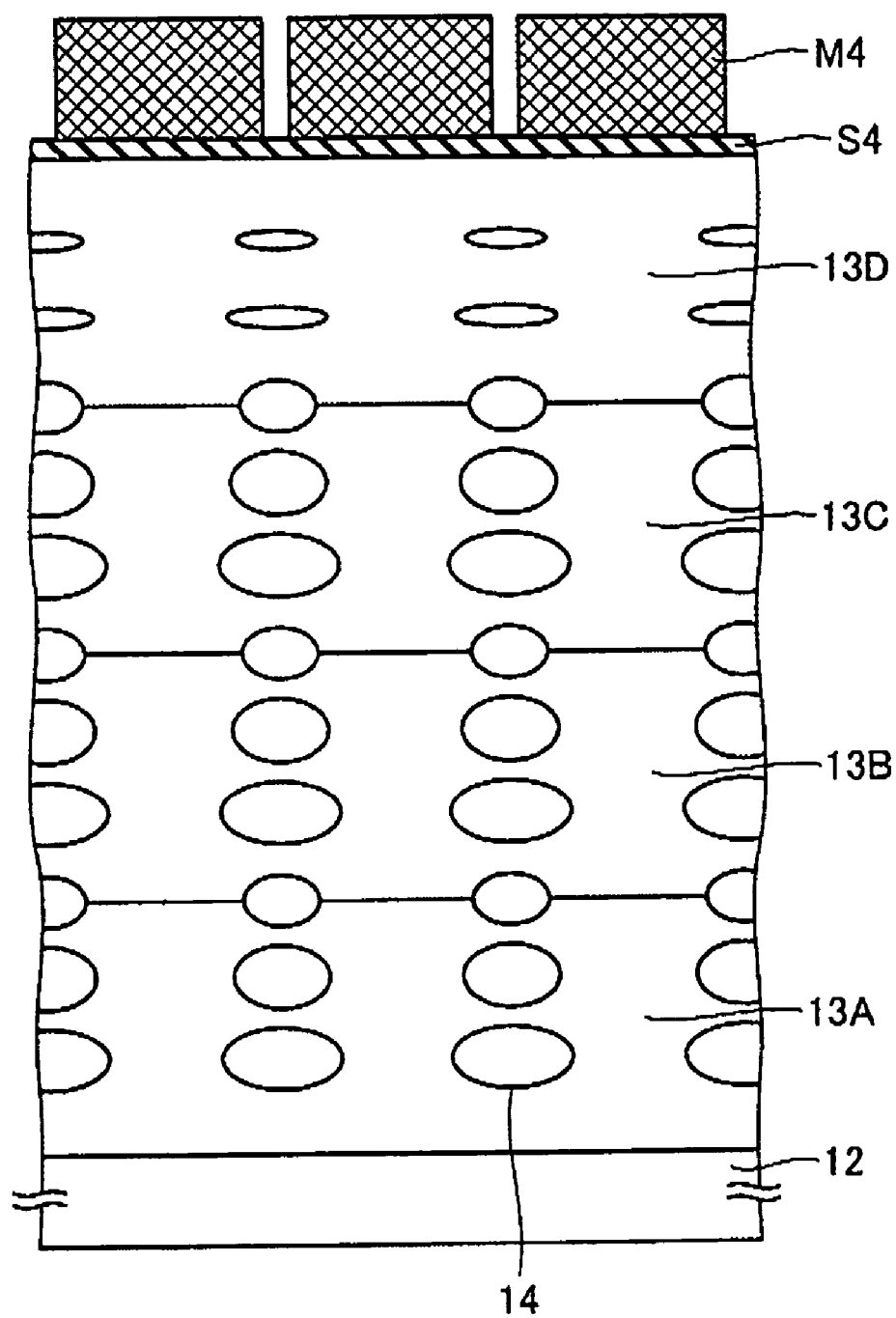
FIG. 14 shows a process step of manufacturing the power MOSFET of FIG. 1.

An example of the process steps of manufacturing the MOSFET 1 shown in FIG. 1 is described with reference to FIGS. 5-14. First, as shown in FIG. 5, on the surface of the n+-type drain layer 12, the epitaxial layer 13A is formed with a thickness of about 10 μm. Next, as shown in FIG. 6, on the epitaxial layer 13A, a thermal oxide film S1 is formed as a protection film, then a layer of resist M1 is formed at an interval corresponding to the pillar pitch Pitch. Subsequently, as shown in FIG. 7, with a mask of the resist M1, ions of a p-type impurity or boron (B) are implanted to different depths while varying the acceleration voltage in the ion implantation equipment. Thereafter, as shown in FIG. 8, the thermal oxide film S1 and the resist M1 are removed, and then the epitaxial layer 13B is deposited with a thickness of about 8.6 μm on the epitaxial layer 13A. As shown, during the deposition, boron implanted into the epitaxial layer 13A is diffused gradually to a certain extent by heat from the epitaxial layers 13A and 13B.

Thereafter, as shown in FIGS. 10-14, similar operations of ion implantation are executed also to the epitaxial layers 13B-13D with masks of resist M2, M3, M4 formed on oxide films S2, S3, S4. A subsequent step of heating the epitaxial layers 13B-13D causes the diffusion layers 14X to be coupled along the depth as shown in FIG. 1 to form the p-type pillars 14 as a whole. When the pillar layer is completed in this way, well-known MOSFET processes are employed to obtain the MOSFET as shown in FIG. 1.

Second Embodiment

FIG. 15A shows a cross-sectional view schematically illustrative of an arrangement of a power MOSFET 1 according to a second embodiment of the present invention. FIG. 15A also shows a graph of a distribution of impurity concentrations in a p-type pillar 14, and a graph of lateral widths W and vertical depths D in a diffusion layer 14X. The components similar to those in the first embodiment are given the same reference numerals and omitted from the following detailed description. In this embodiment, the diffusion layers 14X present in the upper epitaxial layers 13C, 13D are controlled to have higher impurity concentrations. As a result, the impurity concentration in the p-type pillar 14 at the side close to the surface (the source electrode 21) is made higher than that at the side close to the bottom (the drain electrode 11).

In this embodiment, if the impurity concentrations in the epitaxial layers 13A-13D are uniform, in the upper layer portions of the pillar layer the impurity dose amount is larger in the p-type pillar 4 than in the n-type pillar 15 (p-pillar rich). By intentionally providing such the charge-unbalanced portion, the Avalanche withstanding capability under inductance load (UIS performance) can be improved.

Figure 15B:
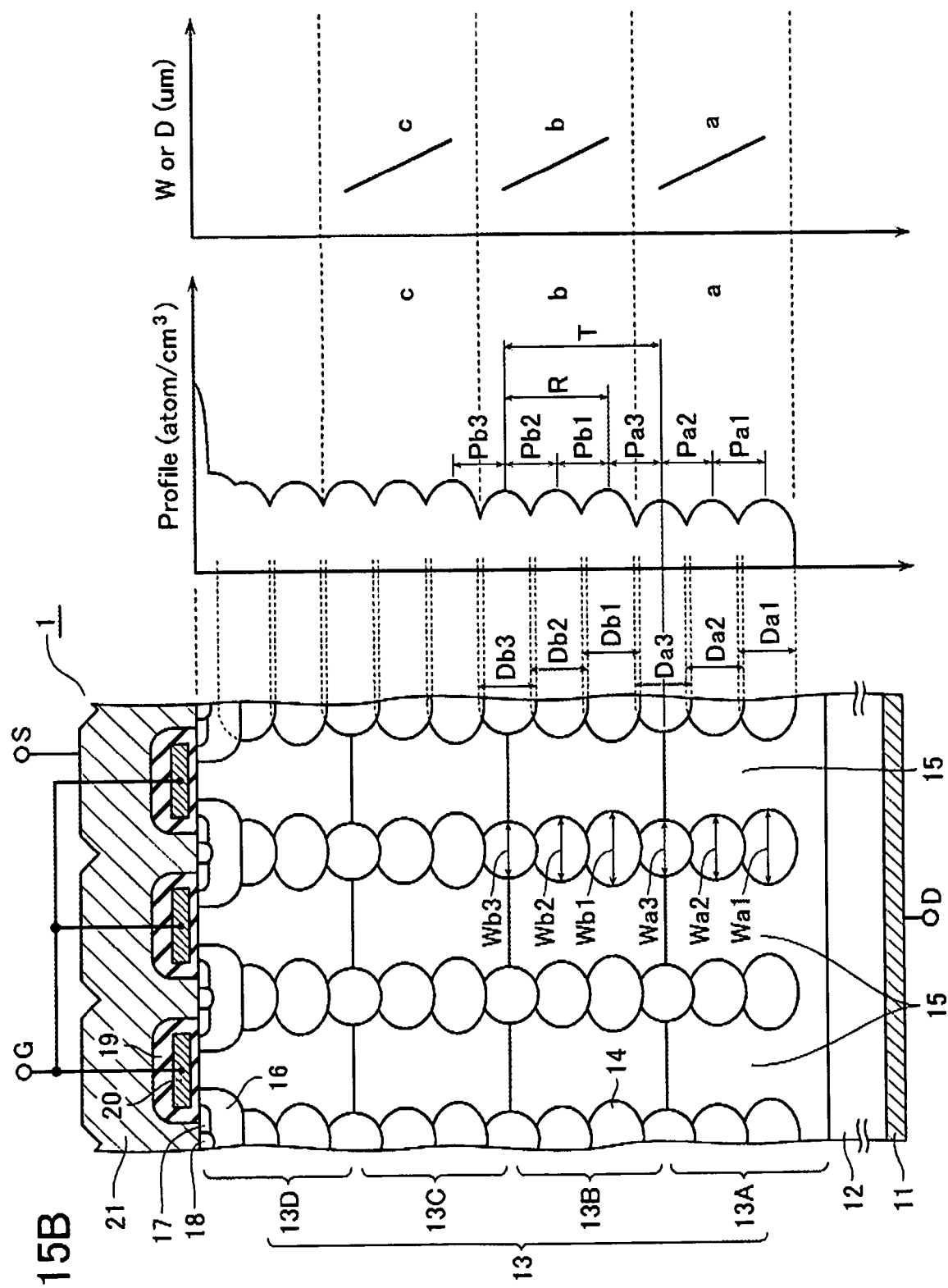
FIG. 15B shows a modification of the second embodiment of the present invention.

To be charge-balanced with the p-type pillar 14, the impurity concentration in the epitaxial layer 13X can be made higher in the higher layer portions (13C, 13D) than in the lower layer portions (13A, 13B). In this case, the lower layer portions in the pillar layer are charge-balanced at a low impurity concentration and the upper layer portions are charge-balanced at a high impurity concentration. In this structure, as the upper layer portions in the pillar layer have a high breakdown voltage, the thicknesses of the epitaxial layers 13C, 13D can be reduced correspondingly. This is effective to suppress the production cost. As described in this embodiment, the impurity concentration in the p-type pillar 14 is varied in two stages. Alternatively, as shown in FIG. 15B, the average of concentrations per epitaxial grown layer 13X may be varied. Further, the dose amount may be varied at every ion implantation to continuously vary the profile of impurity concentrations.

If impurity dose amount on ion-implantation is kept constant and the thicknesses of the epitaxial layers 13X are gradually thinned as approaching the source electrode 21, the same effect can be obtained. In this case, the period T of variation in the distribution of impurity concentrations and so forth can be narrowed as approaching the source electrode 21.

If the above-described period T differs among layers, the epitaxial layers 13X can be controlled to have the following relation.

$$T_X = \left(\frac{1-\alpha}{1+\alpha}\right)^{\frac{1}{N-1}} \times T_{X-1} \qquad \text{[Expression 1]}$$

where $N \geq 2$.

In this expression, TX denotes an X-th period in the p-type pillar 14 counted from the drain electrode 11, and N means a total number of periods. In addition, α denotes a variation rate that indicates the magnitude of tilt given to the distribution of impurity concentrations within the total number of periods in the P-type pillar 14. For example, if three layers (three periods) of the P-type pillars 14 have an average concentration of 100% and a plus/minus concentration tilt of ±30% is given (P-pillar rich at the source electrode 21) then α=0.3 and N=3. Thus, the following expression is given.

$$T_X = \left(\frac{1-\alpha}{1+\alpha}\right)^{\frac{1}{N-1}} \times T_{X-1} \approx 0.734 \times T_{X-1} \qquad \text{[Expression 2]}$$

Accordingly, the period TX is shortened as approaching the source electrode 21. When the epitaxial layer 13X is made thicker and the period T wider than the upper portion as approaching the drain electrode 11, the upper portion (close to the source electrode 21) is made P-pillar rich. This is effective to improve the avalanche withstanding capability.

Third Embodiment

Figure 16:
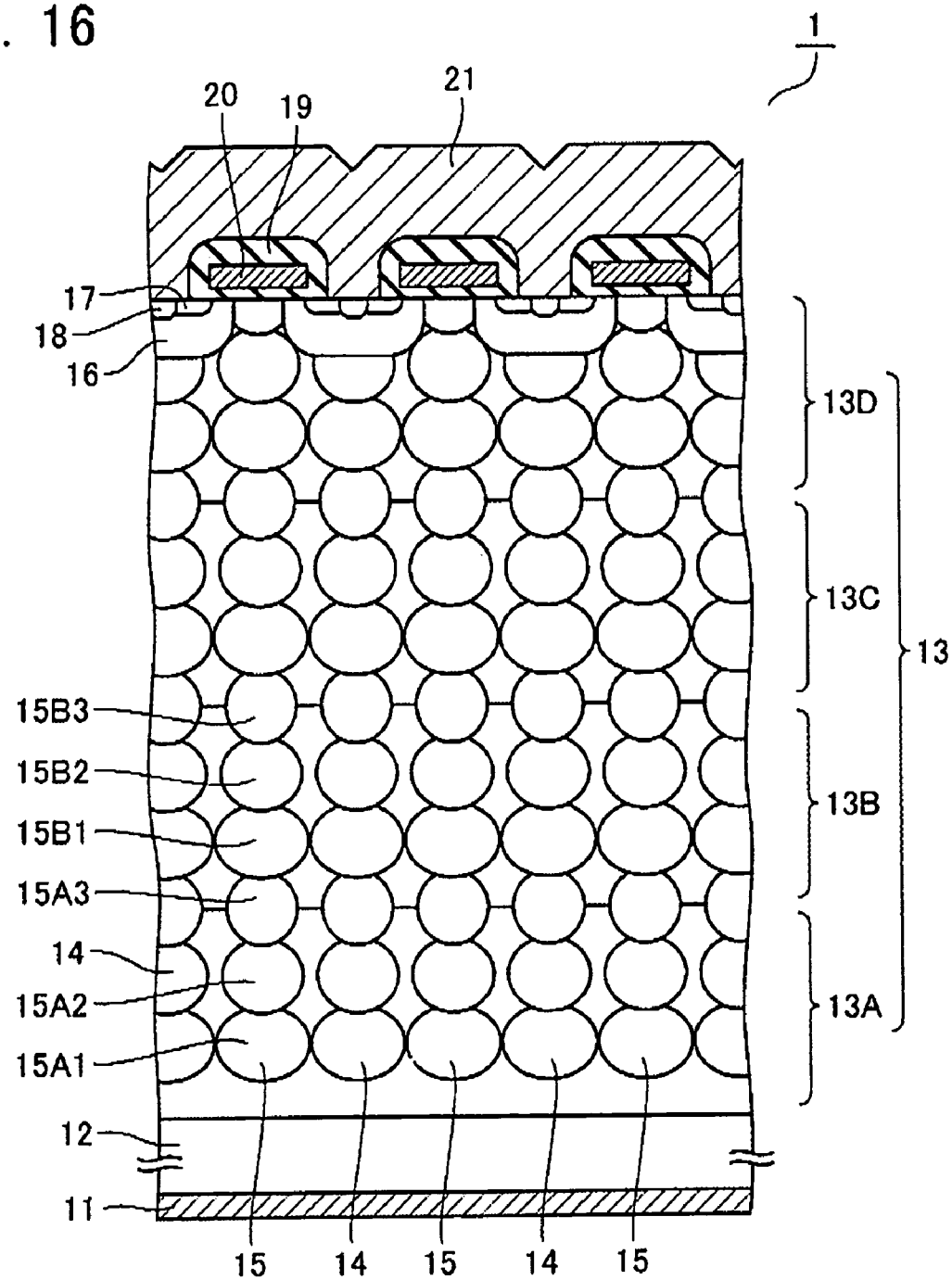
FIG. 16 is a cross-sectional view schematically illustrative of an arrangement of a power MOSFET according to a third embodiment of the present invention.

FIG. 16 shows a cross-sectional view schematically illustrative of an arrangement of a power MOSFET 1 according to a third embodiment of the present invention. In this embodiment, not only the p-type pillar 14, but also the n-type pillar 15 is coupled along the depth, different from the preceding embodiments. Between the portions that contain ion-implanted boron therein to form the p-type pillars 14 (see FIG. 7 and so forth), an n-type impurity or phosphorous (P) is ion-implanted through a similar method to form the pillar layer as shown in FIG. 16. In this case, the impurity concentration in the n-type pillar 15 is determined in the ion implantation step. Therefore, the epitaxial layer serving as the underlying object for ion implantation can be designed to have a high resistance (low impurity concentration). In addition, the p-type pillar 14 and the n-type pillar 15 can be easily charge-balanced with each other. The achievement of the charge balance makes it possible to further increase the impurity concentration in the pillar layer and allow the device to have a high performance such as a lowered on-resistance.

Figure 17:
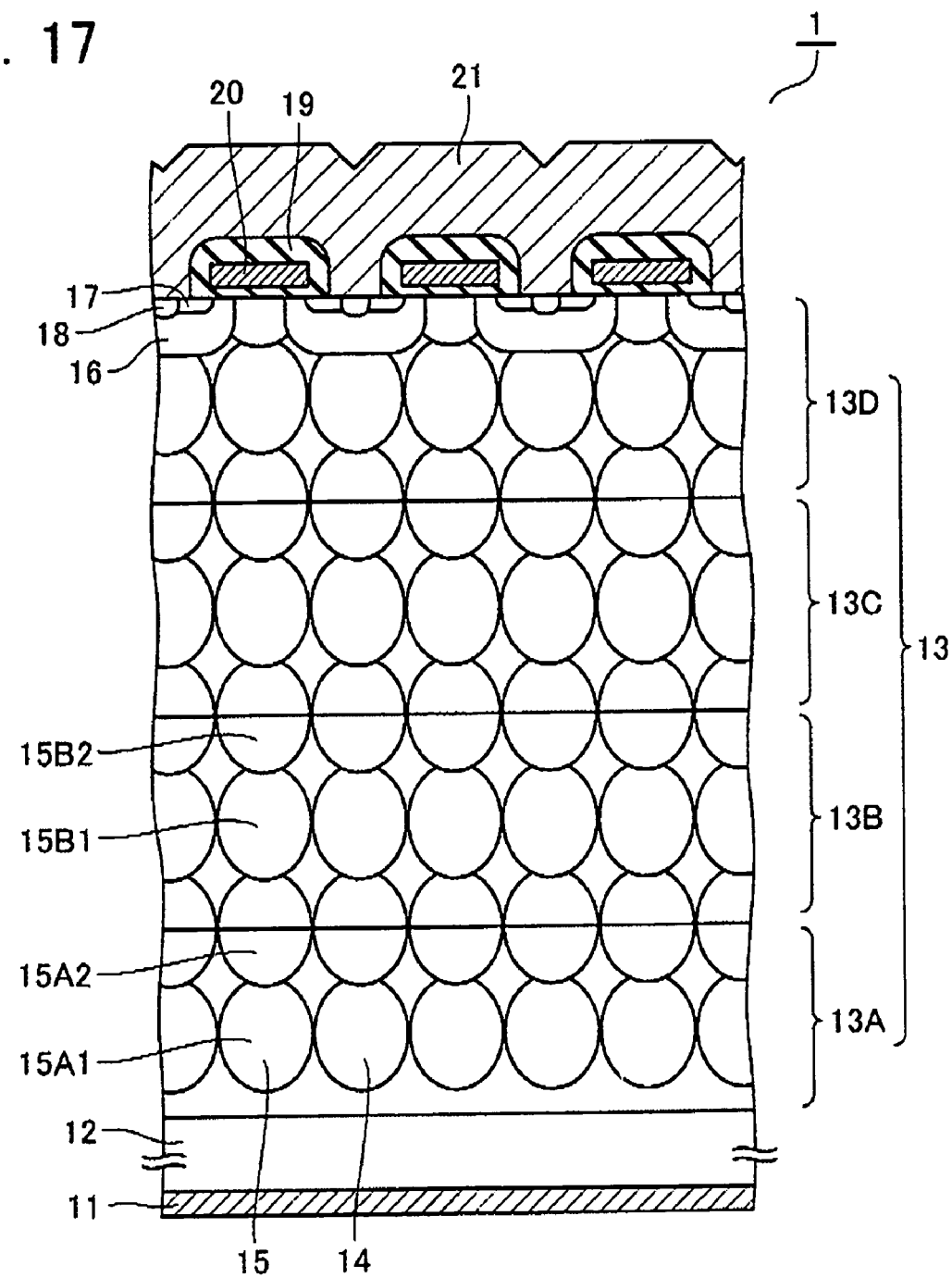
FIG. 17 illustrates an advantage of the third embodiment.

In this embodiment, the process steps can be reduced to achieve a lowered cost compared to the preceding embodiments. Boron for use in formation of the p-type pillar 14 and phosphorous for use in formation of the n-type pillar can be ion-implanted at high concentrations and diffused. In this case, even if the diffusion time is elongated, spreads of the diffusion layers 14X, 15X in the lateral direction can be limited. Therefore, a process of long-time diffusion results in the diffusion layers 14X, 15X having longitudinal shapes as shown in FIG. 17. Accordingly, it is possible to increase the thickness of one epitaxial layer 13X to reduce the process steps and lower the cost correspondingly. Instead, it is possible to increase the aspect ratio achievable in one epitaxial layer to realize a low on-resistance.

Fourth Embodiment

Figure 18:
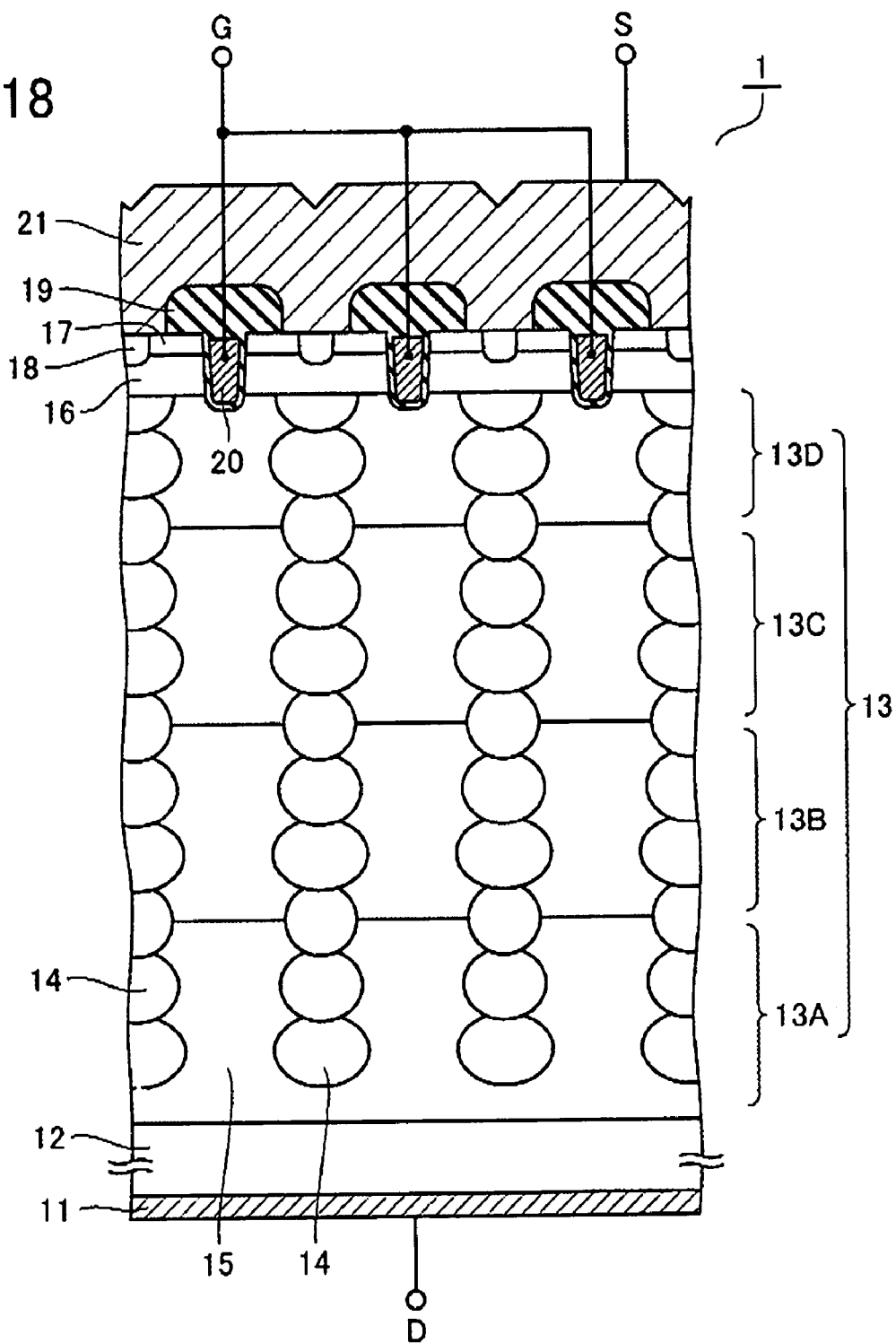
FIG. 18 is a cross-sectional view schematically illustrative of an arrangement of a power MOSFET according to a fourth embodiment of the present invention.

FIG. 18 shows a cross-sectional view schematically illustrative of an arrangement of a power MOSFET 1 according to a fourth embodiment of the present invention. This embodiment adopts the so-called trench gate electrode, different from the above first through third embodiments that adopt the so-called planar gate electrode. Namely, a trench reaching the n-type pillar 15 is formed in the p-type base layer 16, and a gate electrode 20 is buried in the trench with the insulator 19 interposed therebetween. In this structure, the cell pitch can be made smaller than in the planer gate type. Also in this fourth embodiment, like the second embodiment, it is possible to form a p-pillar-rich pillar layer, or a pillar layer having a higher impurity dose amount in the surface than in the bottom. Such the combination of the fourth embodiment and the second embodiment makes it possible to prevent the electric field from concentrating on the oxide film on the trench gate bottom when the drain voltage is applied. In addition, like the third embodiment, it is possible to form then-type pillar 5 by coupling the diffusion layers 15X along the depth.

Fifth Embodiment

Figure 19:
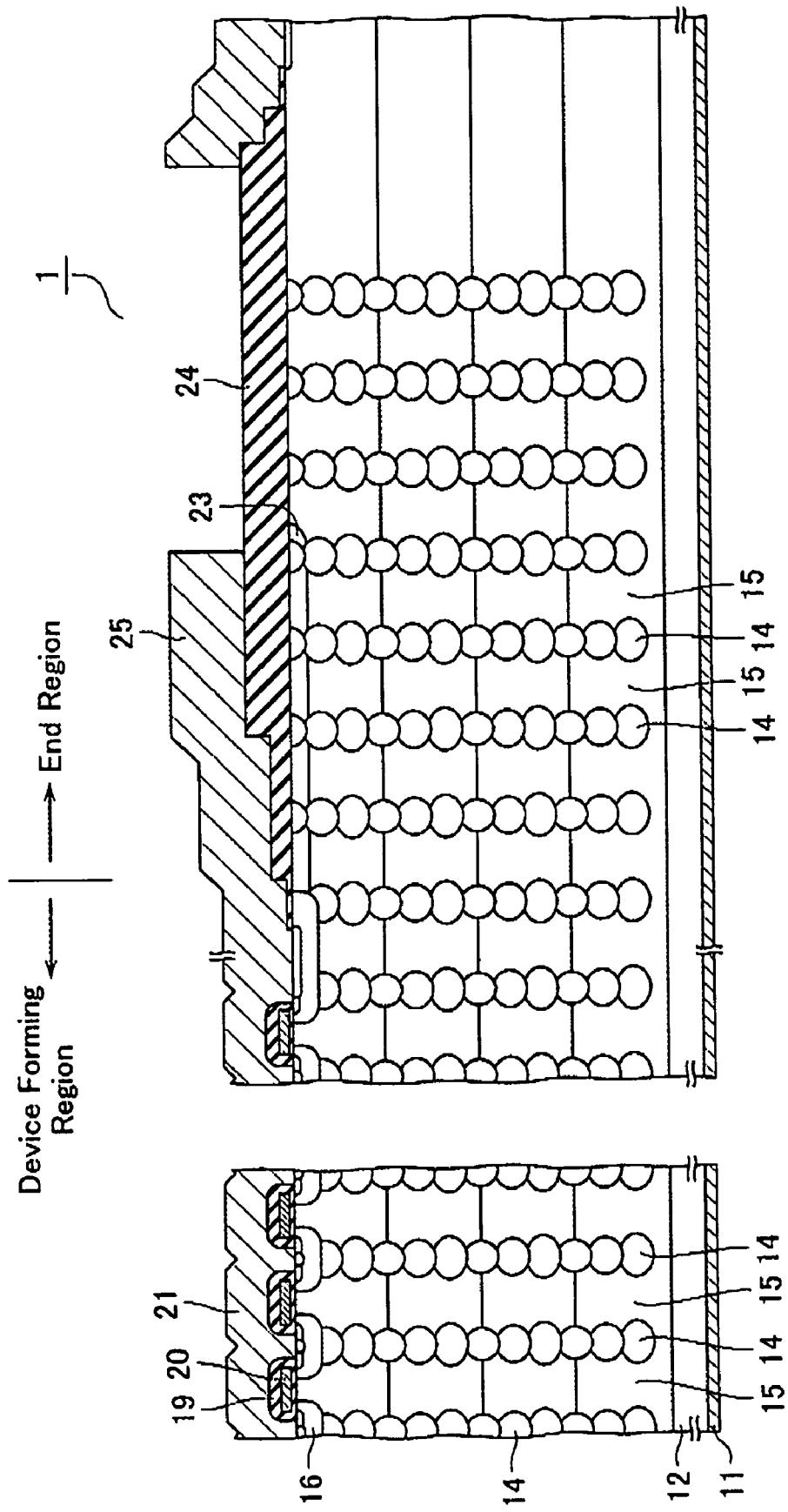
FIG. 19 is a cross-sectional view schematically illustrative of an arrangement of a power MOSFET according to a fifth embodiment of the present invention.

FIG. 19 shows a cross-sectional view schematically illustrative of an arrangement of a power MOSFET according to a fifth embodiment of the present invention. In the MOSFET of this embodiment, not only a device forming region for use in formation of the device, but also a end region surrounding the device forming region has a superjunction structure including the p-type pillars 14 and then-type pillars 15 formed alternately. On the surface of the epitaxial layer 13 in the end region, a p-type resurf layer 23 is formed. On the surface of the resurf layer 23, a field plate 25 connected to the source electrode 21 is formed with an insulator 24 interposed therebetween. This allows a depletion layer to quickly extend laterally in the end region to enhance the breakdown voltage when the power MOSFET 1 is turned off. The field plate 25 may be connected not to the source electrode 21 but to the gate electrode 20 instead. The structure shown herein includes both the p-type resurf layer 23 and the field plate 25 formed therein though it is sufficient to form either one of them.

Figure 20:
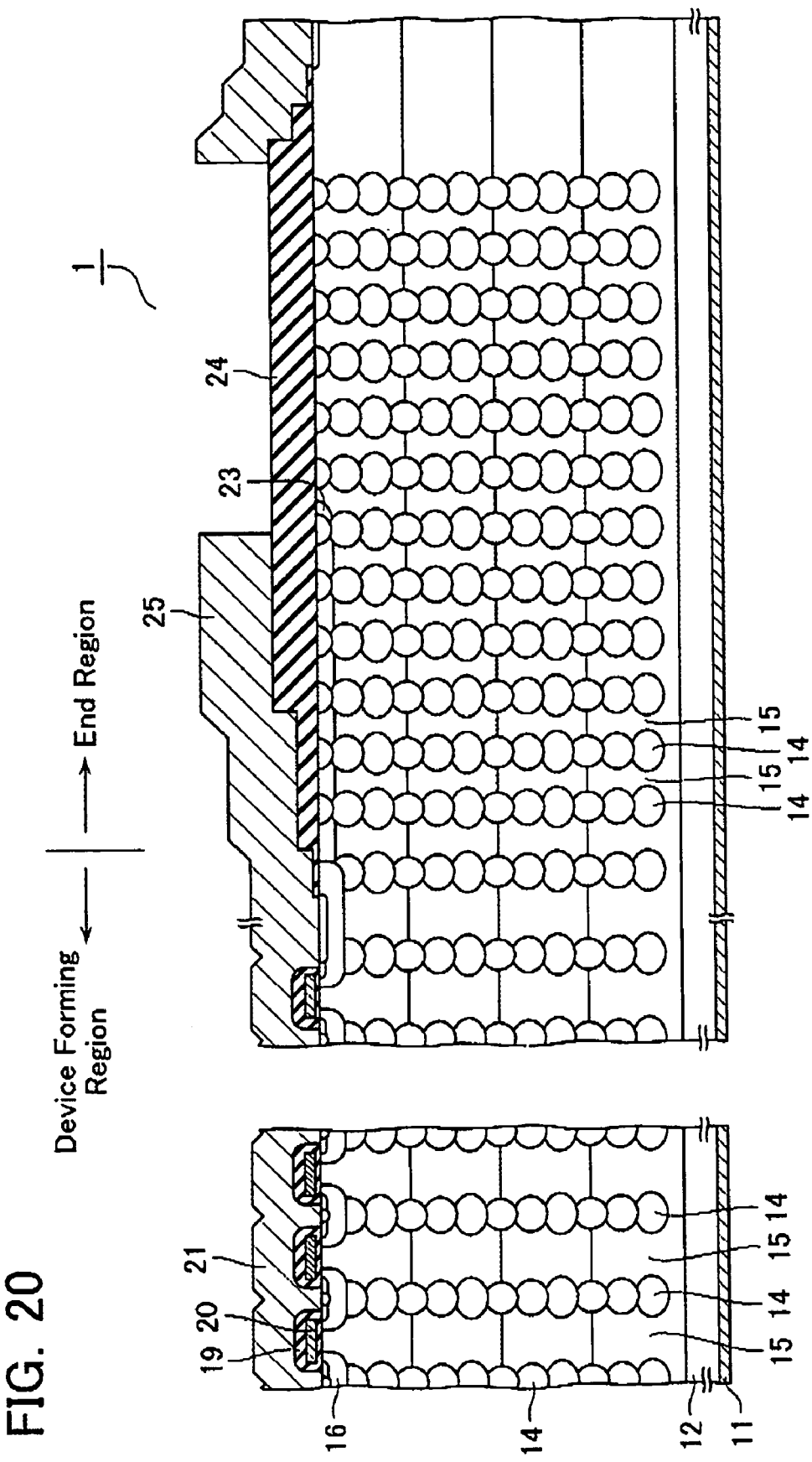
FIG. 20 shows a first modification of the power MOSFET of the fifth embodiment.

FIG. 20 shows a first modification of the fifth embodiment, in which the pillar pitch in the pillar layer in the end region is made narrower than in the device forming region. When the pillar pitch in the end region is narrower, the end region can be depleted more easily than when the pillar pitch is wider, even at the same impurity concentration, and the breakdown voltage can be enhanced correspondingly.

Figure 21:
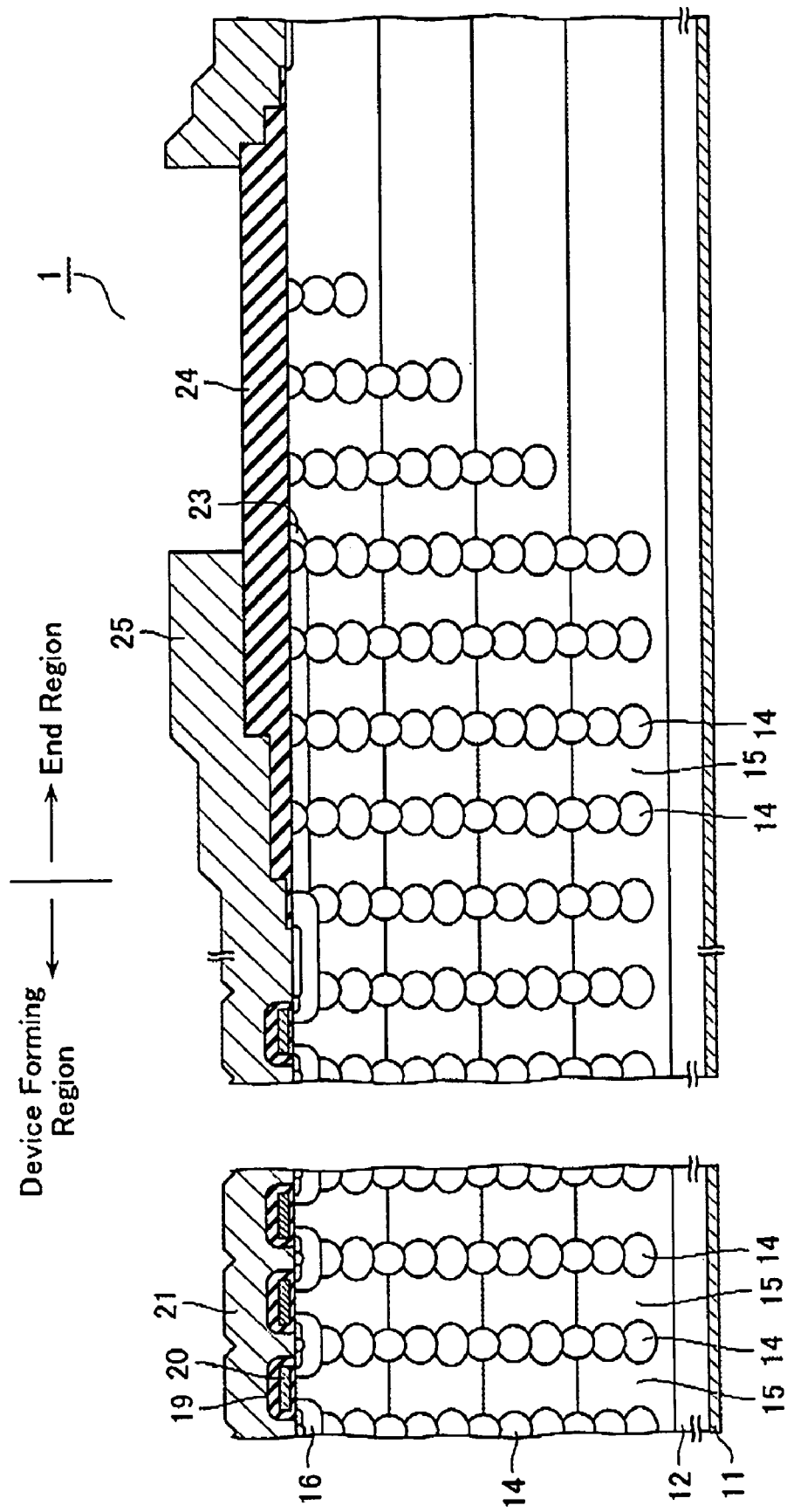
FIG. 21 shows a second modification of the power MOSFET of the fifth embodiment.

FIG. 21 shows a second modification of the fifth embodiment, in which the lengths of the p-type pillars 14 along the depth are gradually shortened with distance from the device forming region. This structure is based on the following consideration. In the device forming region, as the depletion layer extends toward the surface with distance from the device forming region, it is not required to form a longer p-type pillar 14. This is effective to simplify the process steps and achieve a lowered cost.

Figure 22:
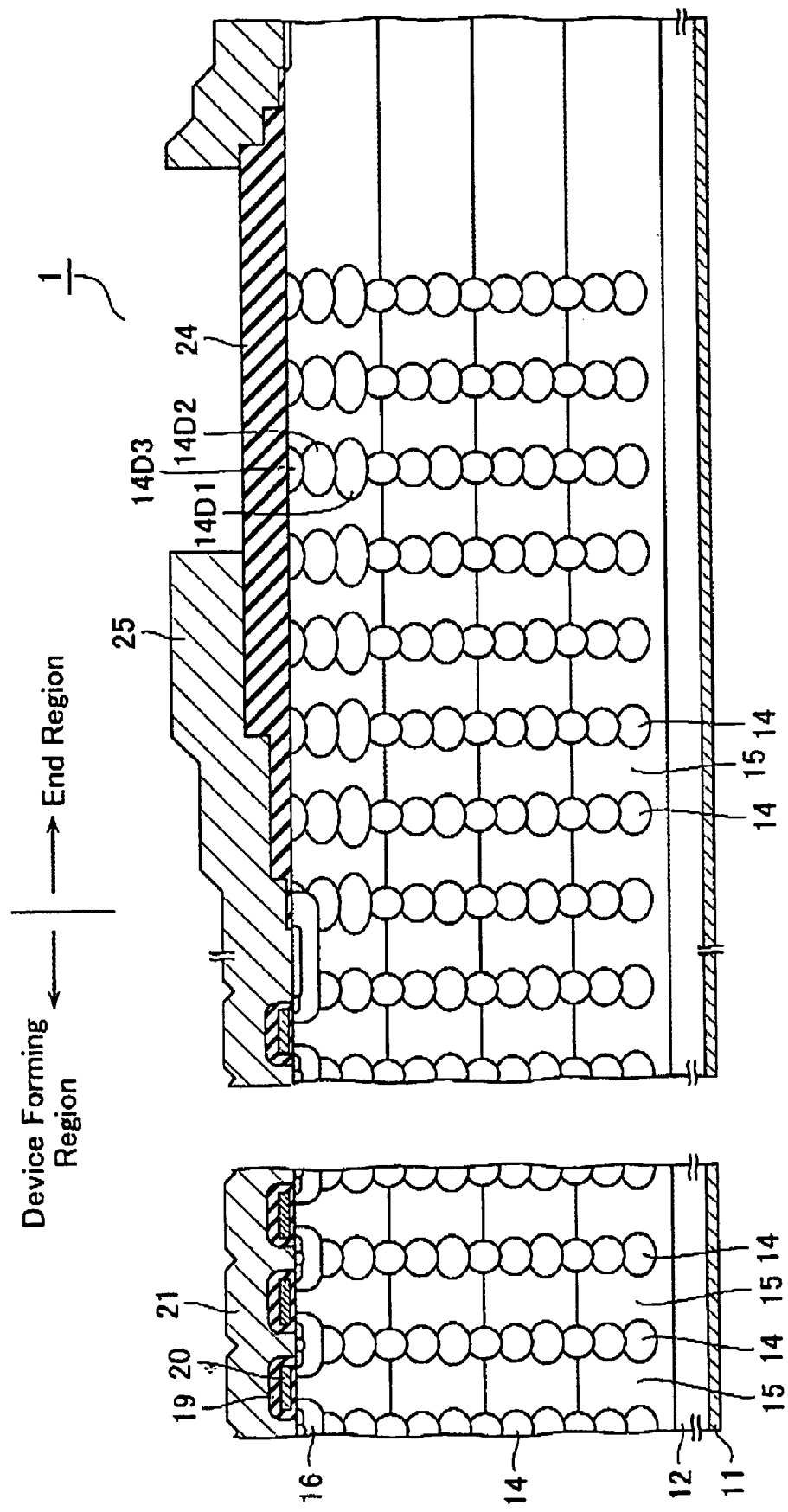
FIG. 22 shows a third modification of the power MOSFET of the fifth embodiment.

FIG. 22 shows a third modification of the fifth embodiment, in which in the end region the diffusion layers 14D1, 14D2, 14D3 in the p-type pillar 14 located close to the surface are controlled to have large lateral widths W and impurity concentrations. As a result, the portion of the p-type pillar 14 close to the surface serves as the so-called guard ring. In FIG.

22 all the p-type pillars 14 in the end region include respective guard rings formed close to the surface though formation of the guard ring is not always required for every one. For example, a guard ring may be formed per several p-type pillars 14.

The embodiments of the invention have been described above though the present invention is not limited to these embodiments but rather various modifications and additions can be devised without departing from the scope and spirit of the invention.

For example, in the above embodiments the first conduction type is described as n-type and the second conduction type as p-type. Instead, the first conduction type may be implemented as V-type and the second conduction type as n-type.

The MOSFET using silicon (Si) as the semiconductor is described. Alternatively, a compound semiconductor, such as silicon carbide (SiC) and gallium nitride (GaN), and a wide band-gap semiconductor, such as diamond, may be employed.

Examples of the MOSFET having the superjunction structure are described though the structure of the present invention is also applicable to any devices so long as they have the superjunction structure, for example, an SBD, a MOSFET-SBD composite device, an SIT, and an IGBT.

Figure 23:
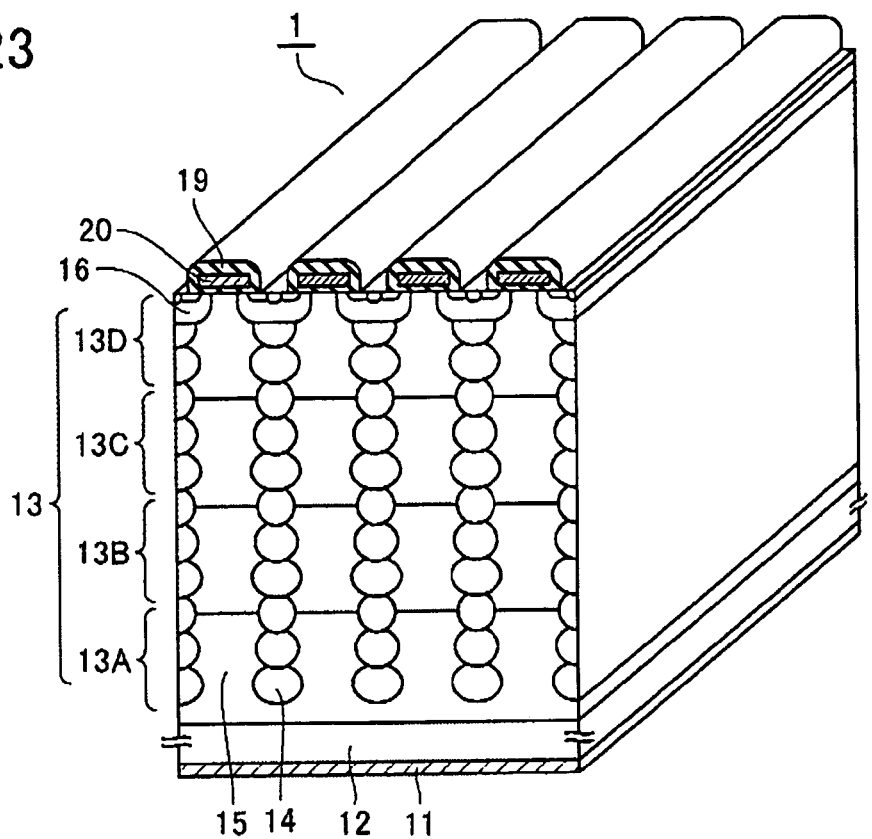
FIG. 23 illustrates a modification of the above embodiment.
Figure 24:
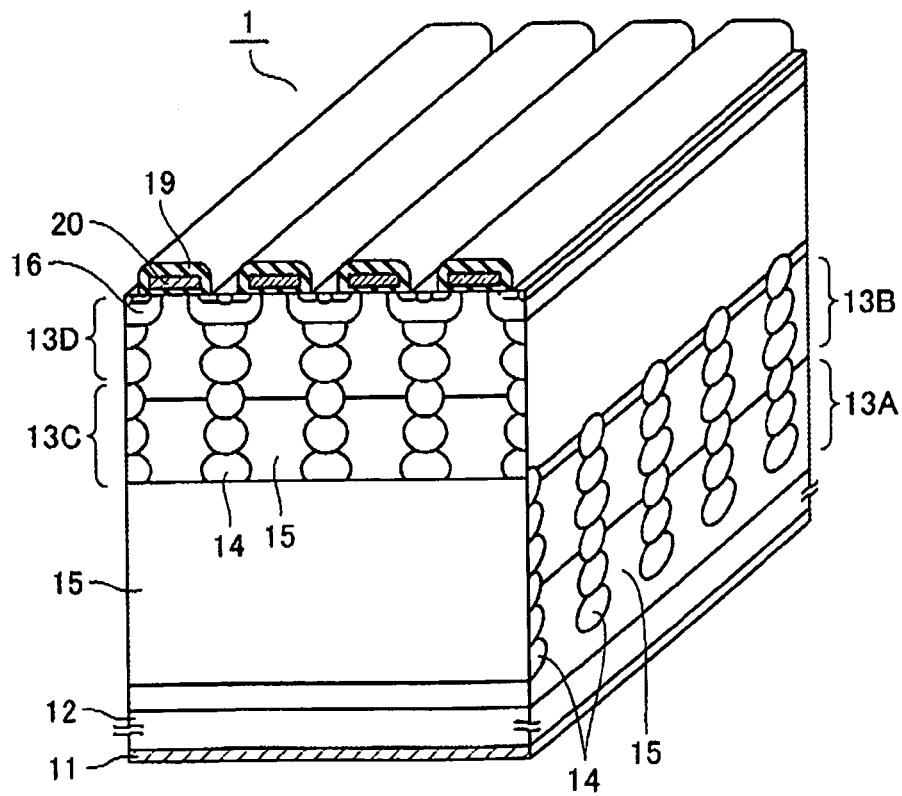
FIG. 24 illustrates a modification of the above embodiment.

In the above embodiments, the p-type pillars 14 and the n-type pillars 15 are arrayed across the four epitaxial layers 13X along the depth as shown in FIG. 23. Alternatively, the p-type pillars 14 and the n-type pillars 15 may have a split shape such that the upper layers and the lower layers intersect at right angles as shown in FIG. 24.

Figure 25:
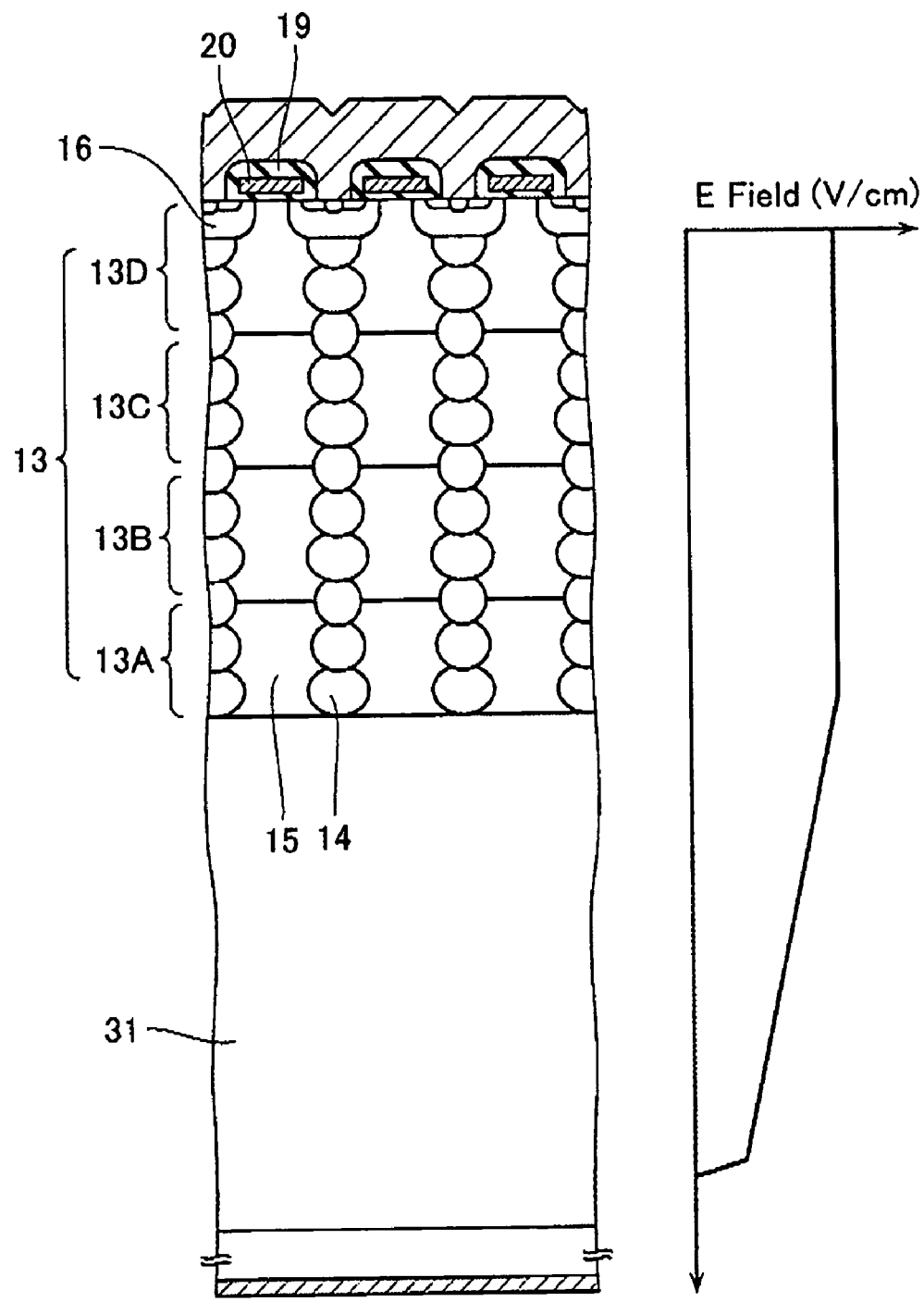
FIG. 25 illustrates a modification of the above embodiment.

Further, as shown in FIG. 25, an n-type epitaxial layer 31 can be formed below the superjunction structure including the p-type pillars 14 and the n-type pillars 15. In this case, the electric field is uniform over the superjunction structure when the MOSFET is turned off while the electric field gradually lowers in the n-type epitaxial layer 31 as approaching the lower layer. Though, it is possible to make the n-type epitaxial layer 31 suffer a breakdown voltage and enhance the overall breakdown voltage across the whole device correspondingly.

Figure 26:
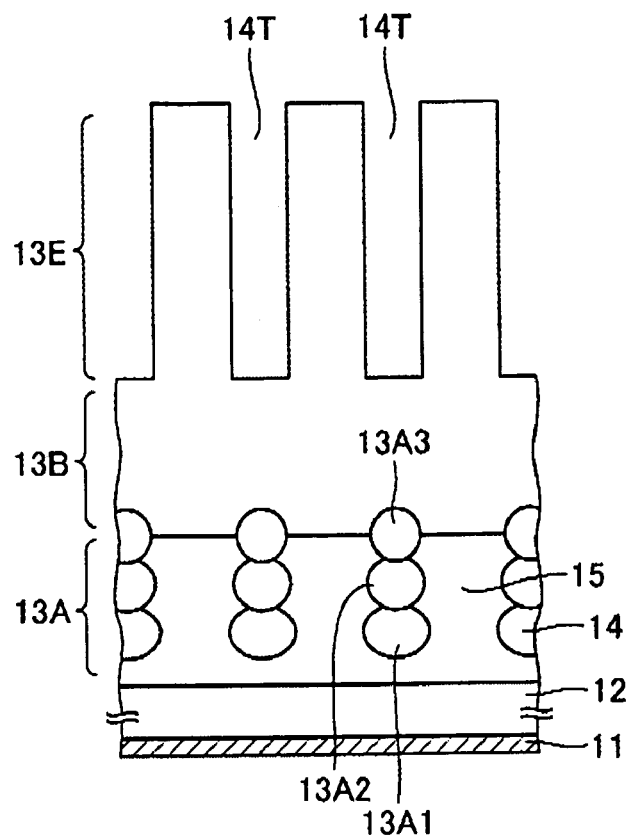
FIG. 26 shows another example of the process step of manufacturing the power MOSFET of the above embodiment.
Figure 27:
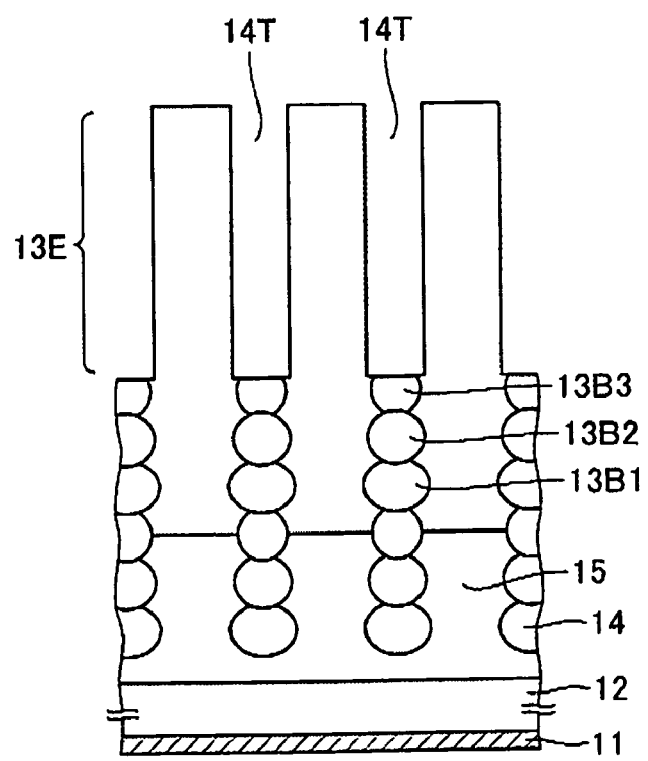
FIG. 27 shows another example of the process step of manufacturing the power MOSFET of the above embodiment.
Figure 28:
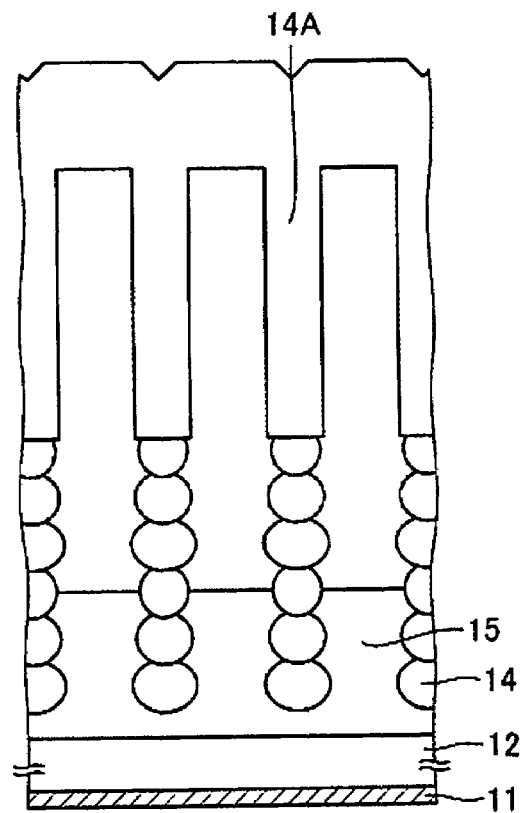
FIG. 28 shows another example of the process step of manufacturing the power MOSFET of the above embodiment.
Figure 29:
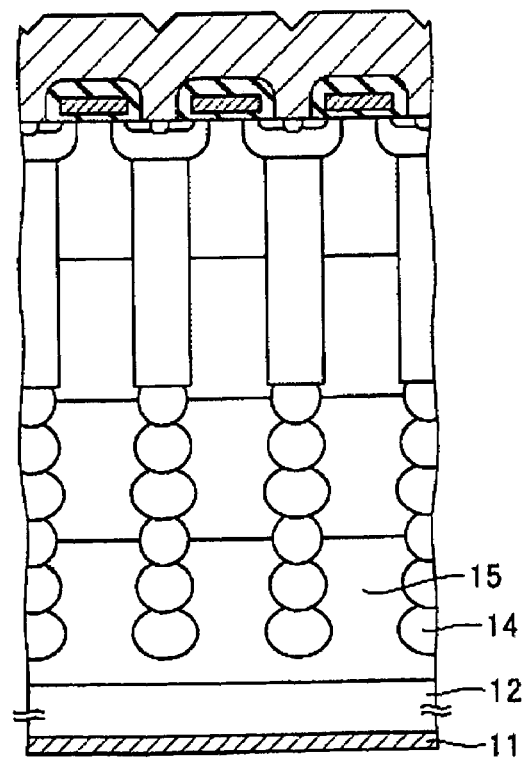
FIG. 29 shows another example of the process step of manufacturing the power MOSFET of the above embodiment.

In the above embodiments, the examples are described about the formation of the pillars 14, 15 by repeating the steps of epitaxial layer formation and impurity ion implantation over the whole superjunction structure as shown in FIGS. 5-14. Alternatively, the lower half of the superjunction structure may be formed through the method shown in FIGS. 5-14 while, the upper half can be formed by filling the trench formed in the epitaxial layer with an epitaxial layer of a different conduction type. This method is described with reference to FIGS. 26-27. As shown in FIG. 26, an impurity is implanted into the epitaxial layer 13A several times with different implantation energy to form the diffusion layers 13A1-3. Thereafter, epitaxial layers 13B, 13E are deposited on the epitaxial layer 13A. Then, trenches 14T are formed in the epitaxial layer 13E at the pillar pitch P. Subsequently, as shown in FIG. 27, using the trenches 14T as a mask, several operations of ion implantation into the epitaxial layer 13B are executed with different implantation energy to form the diffusion layers 13B1-3. Thereafter, as shown in FIG. 28, a p-type epitaxial layer 14A is deposited in the trenches 14T. As a result, the lower portion of the pillar layer resulted from the repetition of epitaxial growth and ion implantation and the upper portion of the pillar layer resulted from the trench formation are coupled together to form the p-type pillars 14. Finally, the epitaxial layer 14A outside the trenches is removed using a method of chemical mechanical polishing (CMP) and then well known MOSFET processes are used to complete the MOSFET. In another possible design, the upper portion of the pillar layer and the lower portion of the pillar layer can extend in orthogonal directions as shown in FIG. 24. In the lower portion of the pillar layer the n-type pillars 15 can be surely formed through application of ion implantation.

Figure 30:
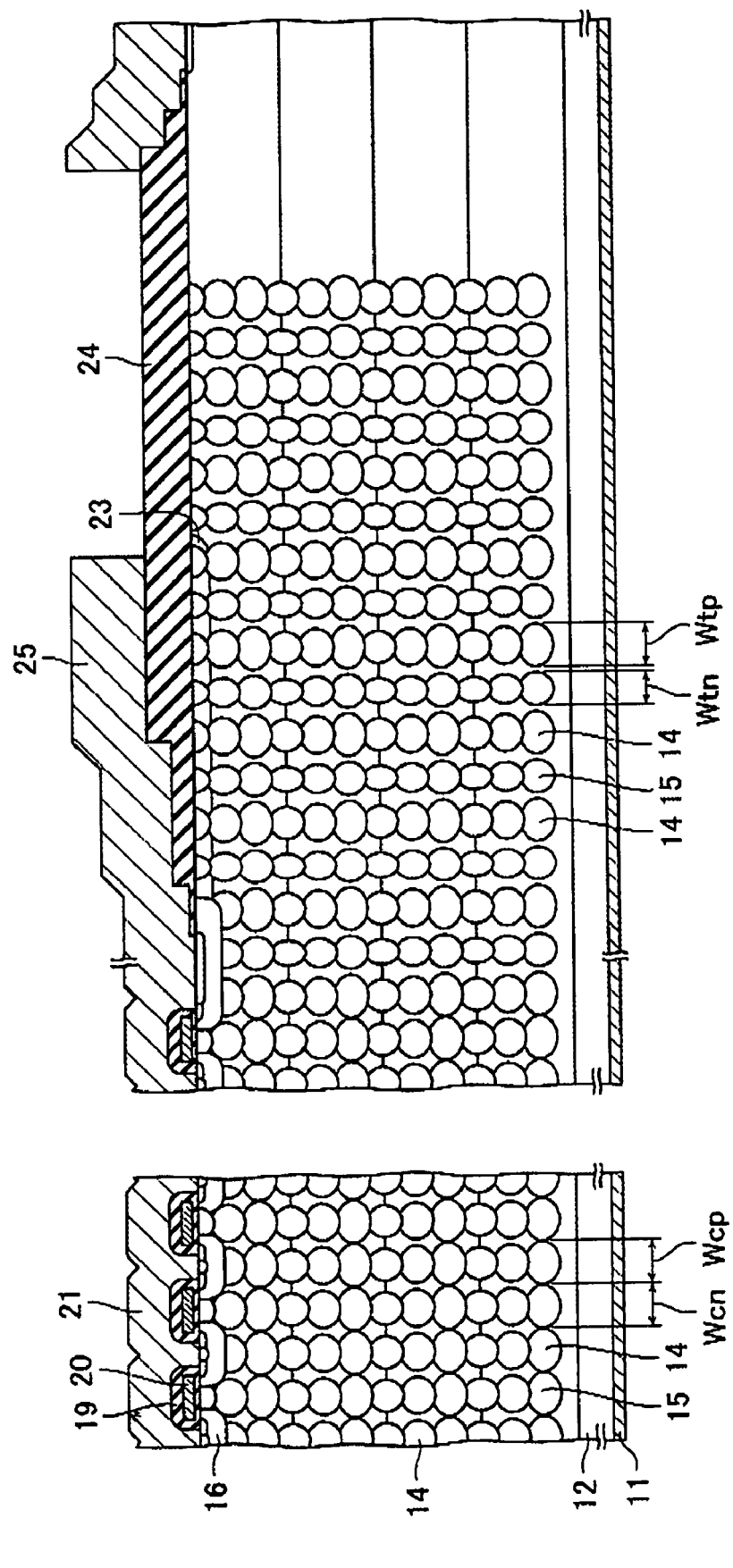
FIG. 30 illustrates a modification of the above embodiment.

In the fourth embodiment, the example is described about the formation of the p-type pillar 14 in the end region by coupling the diffusion layers 14X along the depth. Alternatively, as shown in FIG. 30, the diffused n-type pillar 15 can be formed by coupling the diffusion layers 15X along the depth. In this case, the pillar pitch in the end region may be made same as the pillar pitch in the device forming region. Otherwise, the former may be made smaller than the latter as shown in FIG. 30 to facilitate the depletion. Additionally, in the device forming region, the width Wcp (average) of the p-type pillar 14 can be made almost equal to the width Wcp (average) of the n-type pillar 15. To the contrary, in the end region, the width Wtp (average) of the p-type pillar 14 can be made larger than the width Wtp (average) of the n-type pillar 15. This allows the depletion layer in the end region to extend easily in the lateral direction. In FIG. 30, in the end region only the n-type pillar 15 can be formed by coupling the diffusion layers 15x along the depth while the n-type pillar 15 in the end region can be formed of the n-type epitaxial layer 13 sandwiched between the p-type pillars 14.

What is claimed is:

1. A semiconductor device, comprising:
    a first semiconductor layer of a first conduction type;
    a pillar layer including first semiconductor pillars of the first conduction type and second semiconductor pillars of a second conduction type formed laterally, periodically and alternately on the first semiconductor layer;
    a first main electrode electrically connected to the first semiconductor layer;
    a semiconductor base layer of the second conduction type formed selectively on a surface of said pillar layer;
    a second semiconductor layer of the first conduction type formed selectively on a surface of said semiconductor base layer;
    a second main electrode electrically connected to said second semiconductor layer and said semiconductor base layer; and
    a control electrode formed along said semiconductor base layer with an insulator interposed therebetween to form a channel between said second semiconductor layer and said first semiconductor pillar,
    wherein said first or second semiconductor pillars include a plurality of diffusion layers periodically formed in a third semiconductor layer for a plurality of periods along a depth direction, said plurality of diffusion layers being coupled along the depth direction, a number of said diffusion layers being formed in one of said periods, said third semiconductor layer formed on said first semiconductor layer,
    wherein each of said plurality of diffusion layers in one of the periods has a lateral width in a direction substantially perpendicular to said depth direction different from one another, and
    wherein an average of said lateral widths of said diffusion layers in one of said periods is made almost equal to that in another one of said periods.

2. The semiconductor device according to claim 1, wherein at least one period is different in balance of impurity concentrations between said first and second semiconductor pillars.

3. The semiconductor device according to claim 1, wherein said plurality of diffusion layers have vertical depths varied at certain periods along the depth, wherein an average of said vertical depths of said diffusion layer in one of said certain periods is made almost equal to another between different periods.

4. The semiconductor device according to claim 1, wherein said diffusion layer has a high impurity concentration in part.

5. The semiconductor device according to claim 1, wherein at least one period is different in balance of impurity concentrations between said first and second semiconductor pillars.

6. The semiconductor device according to claim 1, wherein said control electrode is formed on said surface of said semiconductor base layer with said insulator interposed therebetween.

7. The semiconductor device according to claim 1, wherein said gate electrode is formed by burying a conductive layer in a trench with said insulator interposed therebetween, said trench reaching said first semiconductor pillars through said semiconductor base layer.

8. The semiconductor device according to claim 1, wherein said first and second semiconductor pillars are formed in the shape of stripes extending in the same direction.

9. The semiconductor device according to claim 1, wherein said first and second semiconductor pillars are formed in the shape of a grid or zigzag in section along said first semiconductor layer.

10. The semiconductor device according to claim 1, wherein said first and second semiconductor pillars are also formed in an end region surrounding a device forming region.

11. The semiconductor device according to claim 10, wherein said first and second semiconductor pillars in said end region are formed at narrower periods than in said device forming region.

12. The semiconductor device according to claim 10, wherein said first and second semiconductor pillars in said end region have depths decreasing with distance from said device forming region.

13. The semiconductor device according to claim 10, wherein said first or second semiconductor pillars in said end region have lateral widths made larger on the side close to said second main electrode than on the side close to said first main electrode.

14. The semiconductor device according to claim 10, wherein said first or second semiconductor pillars have distribution of impurity concentrations, the distribution having several peaks in one of the periods, and the distances between the peaks are different from one another in one of the periods.

15. A semiconductor device, comprising:
a first semiconductor layer of a first conduction type;
a pillar layer including first semiconductor pillars of the first conduction type and second semiconductor pillars of a second conduction type formed laterally, periodically and alternately on said first semiconductor layer;
a first main electrode electrically connected to said first semiconductor layer;
a semiconductor base layer of the second conduction type formed selectively on a surface of said pillar layer;
a second semiconductor layer of the first conduction type formed selectively on a surface of said semiconductor base layer;
a second main electrode electrically connected to said second semiconductor layer and said semiconductor base layer; and
a control electrode formed along said semiconductor base layer with an insulator interposed therebetween to form a channel between said second semiconductor layer and said first semiconductor pillars,
wherein said first or second semiconductor pillars include a plurality of diffusion layers formed in a third semiconductor layer as coupled along a depth direction, said third semiconductor layer formed on said first semiconductor layer,
wherein said third semiconductor layer includes a plurality of stacked epitaxial layers,
wherein said plurality of diffusion layers are arrayed along the depth direction in each one of said epitaxial layers, each of said diffusion layers in one of said epitaxial layers has a lateral width in a direction substantially perpendicular to said depth direction different from one another,
wherein the plurality of diffusion layers have distributions of impurity concentration, the distributions having several peaks in one of said epitaxial layers, and
wherein $R>T/2$ is realized where T denotes a thickness of any one of said epitaxial layers, and R denotes a distance between said peaks in the uppermost layer and the lowermost layer in said one epitaxial layer with the thickness T.

16. The semiconductor device according to claim 15, wherein $T-R>\text{Wave}\times 0.3$ is realized where Wave denotes an average of widths of a plurality of diffusion layers arrayed along the depth in one epitaxial layer.

* * * * *